(12) United States Patent
Murai

(10) Patent No.: US 6,955,927 B2
(45) Date of Patent: Oct. 18, 2005

(54) METHOD FOR MANUFACTURING FERROELECTRIC THIN FILM DEVICE, INK JET RECORDING HEAD AND INK JET PRINTER

(75) Inventor: Masami Murai, Nagano (JP)

(73) Assignee: Seiko Epson Corporation, Nagano (JP)

( * ) Notice: Subject to any disclaimer, the term of this patent is extended or adjusted under 35 U.S.C. 154(b) by 54 days.

(21) Appl. No.: 10/806,095

(22) Filed: Mar. 23, 2004

(65) Prior Publication Data

US 2004/0173823 A1 Sep. 9, 2004

Related U.S. Application Data

(63) Continuation of application No. 10/290,290, filed on Nov. 8, 2002, now Pat. No. 6,730,524, which is a continuation of application No. 09/418,309, filed on Oct. 14, 1999, now Pat. No. 6,599,757.

(30) Foreign Application Priority Data

| Oct. 14, 1998 | (JP) | ................................ 10-292470 |
| Jul. 13, 1999 | (JP) | ................................ 11-199432 |
| Jul. 16, 1999 | (JP) | ................................ 11-203812 |
| Aug. 31, 1999 | (JP) | ................................ 11-245966 |

(51) Int. Cl.⁷ .............................................. H01L 21/00
(52) U.S. Cl. ........................................ 438/3; 438/48
(58) Field of Search .................... 438/3, 240, 381, 438/685, 686, 785, 643, 644, 48

(56) References Cited

U.S. PATENT DOCUMENTS

| 5,122,923 A | 6/1992 | Matsubara et al. |
| 5,191,510 A | 3/1993 | Huffman |
| 5,576,564 A | 11/1996 | Satoh et al. |
| 5,696,394 A | 12/1997 | Jones, Jr. et al. |
| 5,802,686 A | 9/1998 | Shimada et al. |

(Continued)

FOREIGN PATENT DOCUMENTS

| EP | 0 698 490 A2 | 2/1996 |
| EP | 0 736 385 A1 | 10/1996 |
| EP | 0 785 579 A1 | 7/1997 |
| EP | 0 797 244 A2 | 9/1997 |
| EP | 0 821 415 | 1/1998 |

(Continued)

OTHER PUBLICATIONS

Iwao Kunishima, Hisami Okuwada, Abstract, "Current Leakage Mechanism of PZT Capacitor on IR Electrode Microelectronics Engineering Laboratory" 59$^{th}$ Scientific Lecture on Applied Physics, p. 450 (including English Translation).

Primary Examiner—Tuan H. Nguyen
(74) Attorney, Agent, or Firm—Sterne, Kessler, Goldstein and Fox P.L.L.C.

(57) ABSTRACT

It is an object of the present invention to control the crystal orientation of a ferroelectric thin film as dictated by the application of a ferroelectric thin film device. To accomplished the stated object, a bottom electrode containing at least iridium is formed over a surface preparation layer whose main component is zirconium oxide, and an ultra-thin titanium layer is laminated over the bottom electrode. An amorphous layer containing the elemental metal and elemental oxygen that constitute the ferroelectric is formed over the titanium layer, and a crystallized ferroelectric thin film is formed by heat treating this amorphous layer. If the thickness of the titanium layer is kept between 2 nm and 10 nm in the lamination thereof, the ferroelectric thin film will have a priority orientation of (100), and if it is kept between 10 nm and 20 nm, the ferroelectric thin film will have a priority orientation of (111).

3 Claims, 18 Drawing Sheets

U.S. PATENT DOCUMENTS

| | | | |
|---|---|---|---|
| 5,814,849 A | 9/1998 | Azuma et al. | |
| 5,933,167 A | 8/1999 | Shimada et al. | |
| 5,998,236 A | 12/1999 | Roeder et al. | |
| 6,208,400 B1 | 3/2001 | Kameyama et al. | |
| 6,239,462 B1 | 5/2001 | Nakao et al. | |
| 6,246,156 B1 * | 6/2001 | Takeuchi et al. | 310/328 |
| 6,278,146 B1 | 8/2001 | Nakamura | |
| 6,294,860 B1 | 9/2001 | Shimada et al. | |
| 6,333,537 B1 | 12/2001 | Arita | |
| 6,337,238 B1 | 1/2002 | Nakabayashi | |
| 6,360,606 B2 | 3/2002 | Hirota et al. | |
| 6,399,521 B1 * | 6/2002 | Zhang et al. | 438/785 |
| 6,414,975 B1 | 7/2002 | Ishibashi et al. | |
| 2002/0080213 A1 | 6/2002 | Shimada et al. | |

FOREIGN PATENT DOCUMENTS

| | | |
|---|---|---|
| EP | 0 867 952 | 9/1998 |
| EP | 0 886 328 | 12/1998 |
| JP | 5-281500 | 10/1993 |
| JP | 6-112504 | 4/1994 |
| JP | 7 245236 | 9/1995 |
| JP | 7-245237 | 9/1995 |
| JP | 7-245287 | 9/1995 |
| JP | 8-58088 | 3/1996 |
| JP | 8-112896 | 5/1996 |
| JP | 8-335676 | 12/1996 |
| JP | 9-260516 | 10/1997 |
| JP | 9-280947 | 10/1997 |

* cited by examiner

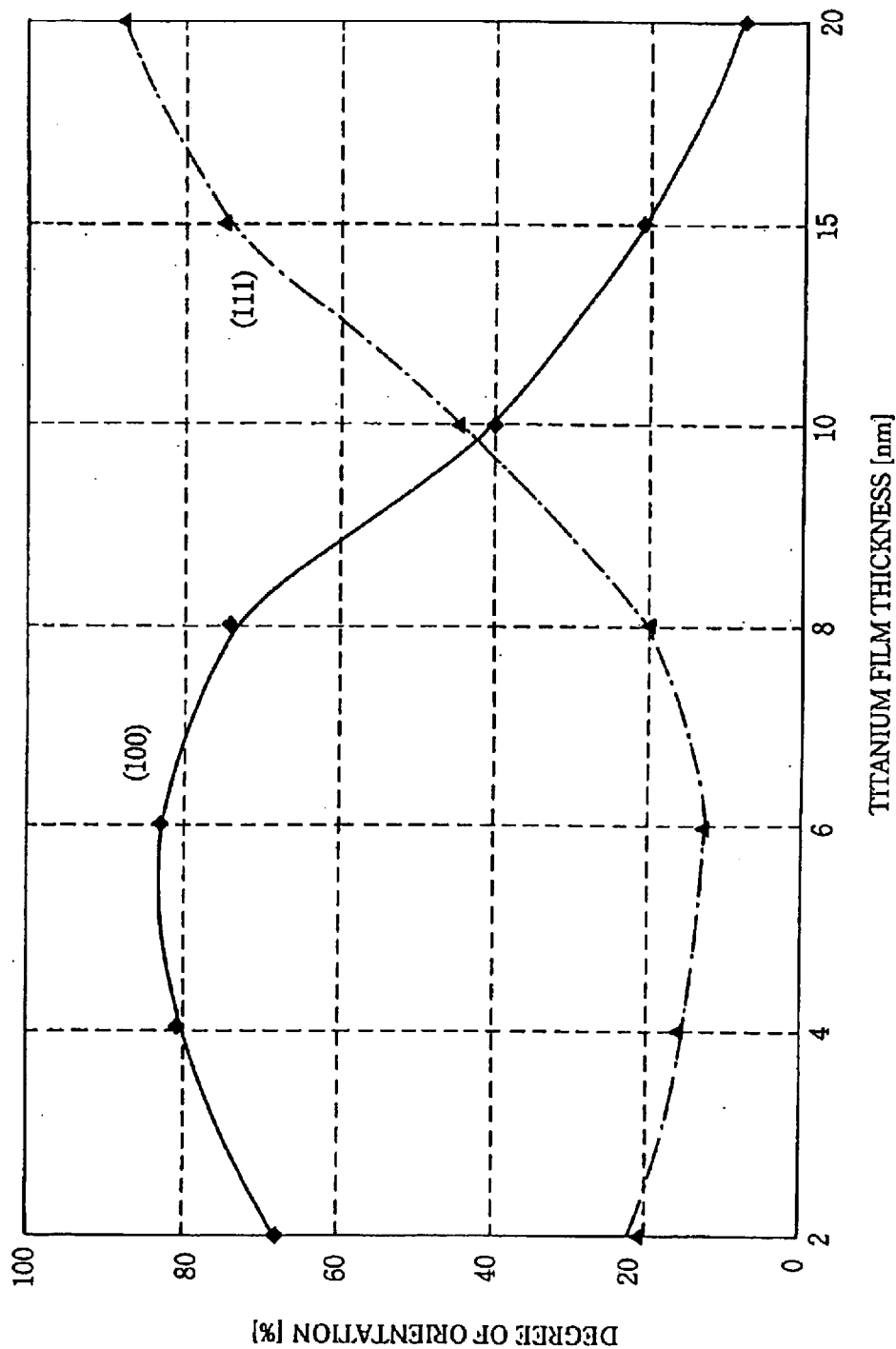

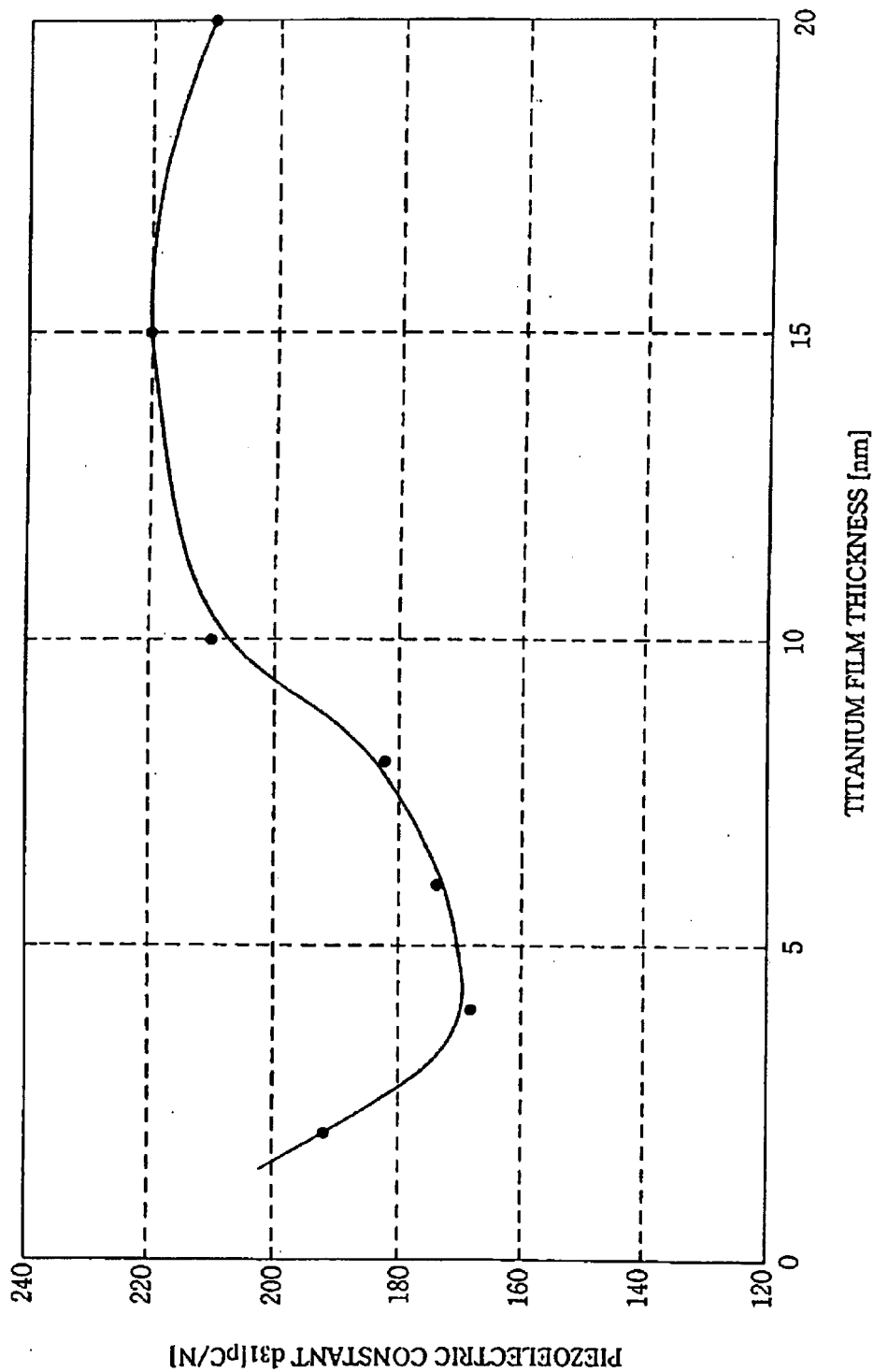

METHOD FOR MANUFACTURING FERROELECTRIC THIN FILM DEVICE, INK JET RECORDING HEAD AND INK JET PRINTER

BACKGROUND OF THE INVENTION

1. Field of the Invention

The present invention relates to ferroelectric thin film device that functions as a piezoelectric device, a nonvolatile ferroelectric memory device, a pyroelectric device, or the like, and more particularly to a technique for controlling the orientation of a ferroelectric thin film, and to a technique for improving the bottom electrode of this ferroelectric thin film device.

2. Description of the Related Art

Crystalline materials consisting of compound oxides that exhibit ferroelectricity, such as lead titanate zirconate, barium titanate, and lithium niobate, have numerous functions, including spontaneous polarization, a high dielectric constant, an electro-optical effect, a piezoelectric effect, and a pyroelectric effect, and as such are used in the development of a wide range of devices. For instance, the piezoelectric properties of these materials are utilized in capacitors in FRAM (Ferroelectric Random Access Memory), DRAM (Dynamic Random Access Memory), and the like, their pyroelectric properties are utilized in infrared linear array sensors, and their electro-optical effect is utilized in wave-guide type light modulators, so these materials can be used in many different fields. Ferroelectric thin film devices having these various functions are also called functional devices.

It is often the case with a ferroelectric thin film device such as this that the characteristics vary with the crystal orientation of the ferroelectric thin film. For example, most lead titanate-based ferroelectrics, which are a type of ferroelectric having a perovskite type crystal structure, have a tetragonal crystal structure, and have spontaneous polarization in the c axis direction. Accordingly, spontaneous polarization in the direction perpendicular to the substrate can be maximized by orienting the c axis to be perpendicular to the substrate (c axis orientation treatment), allowing the performance of a ferroelectric thin film device in which this characteristic is utilized to be utilized to full advantage.

For this reason, it is important to control the crystal orientation in the formation of a ferroelectric thin film, and particularly a lead titanate-based ferroelectric film having a perovskite type crystal structure. Furthermore, since the electrical characteristics of these ferroelectric thin films vary with the orientation of the crystal plane, an orientation treatment must be performed according to the intended application of the ferroelectric thin film device. For example, a (100) priority orientation is known to be preferable with a nonvolatile ferroelectric memory device that makes use of the polarization characteristics of a ferroelectric thin film, such as a FRAM. With a piezoelectric device that is utilized as an electromechanical transducer (actuator), in the case of DC drive, a (111) priority orientation is known to be preferred because of the piezoelectric constant $d_{31}$ characteristics in the drive voltage region.

Except in the case of natural orientation, the crystal orientation of a ferroelectric thin film is affected by the crystal orientation of the bottom electrode or substrate that serves as the base in the formation of the ferroelectric thin film. Accordingly, proper selection of the material of the bottom electrode or substrate that serves as the base is absolutely essential to controlling the orientation of a ferroelectric thin film. Generally, a silicon substrate is used as the substrate of a ferroelectric thin film, and a silicon dioxide film is formed in order to ensure good electrical insulation between the bottom electrode and the substrate, so a required characteristic of the bottom electrode is that it have good orientability even when formed on an amorphous film. Platinum electrodes have been used in the past as electrodes that satisfy this requirement. The lattice constant of a platinum electrode is matched to that of lead titanate zirconate, and because platinum is resistant to oxidation, no platinum oxide layer is formed at the interface with the dielectric layer, so the performance of the device tends not to deteriorate.

As to technology related to the bottom electrode, it has been reported in Japanese Patent Laid-Open No.07-245236 that a structure having an iridium layer or an alloy layer of platinum and iridium as the bottom electrode is favorable in terms of the matching of the lattice constants of the bottom electrode and PZT. Japanese Patent Laid-Open No.08-335676 deals with an improvement on this technology, reporting that if nuclei of a component element of PZT (titanium) are formed on the bottom electrode in a structure having an iridium layer or an alloy layer of platinum and iridium as the bottom electrode, crystals will grow around the nuclei and good contact with the PZT film can be ensured.

As to technology related to the substrate that serves as a base, it has been reported in Japanese Patent Laid-Open No.5-281500 that a lithium niobate thin film is formed by sol-gel method on a sapphire (001) plane monocrystalline substrate. According to this technique, the axis of crystallization of a ferroelectric thin film can be uniaxially oriented by utilization of the crystallinity of the substrate.

However, even though it was possible to form a ferroelectric thin film with excellent orientability by optimizing the conditions that affect the orientation of a ferroelectric thin film by means of the bottom electrode (or substrate), such as matching the lattice constants of the bottom electrode (or substrate) and the ferroelectric thin film, as with the above-mentioned prior art, it was difficult to control the orientation of a ferroelectric thin film as desired according to the intended application of the ferroelectric thin film. For instance, if an attempt was made to vary the film formation conditions in the formation of a PZT film by sol-gel method, it was difficult to control the (100) priority orientation, which is favorable for a nonvolatile ferroelectric memory device, and the (111) priority orientation, which is favorable for the DC drive of an electromechanical transducer, as desired.

Also, diligent study by the inventors revealed that when a ferroelectric thin film device is used as an electromechanical transducer, the piezoelectric constant $d_{31}$ will be higher if the ferroelectric thin film is set to a priority orientation of (111) in a drive frequency band of just a few kHz (low frequency band), and the piezoelectric constant $d_{31}$ will be higher if the ferroelectric thin film is set to a priority orientation of (100) in a drive frequency band of several dozen kHz (high frequency band). This seems to be because the piezoelectric constant $d_{31}$ remains more or less constant regardless of the drive frequency if the ferroelectric thin film is set to a priority orientation of (100), whereas the piezoelectric constant $d_{31}$, decreases in value as the drive frequency goes up if the ferroelectric thin film is set to a priority orientation of (111). It is therefore desirable to be able to control as desired the orientation of a ferroelectric thin film according to the drive frequency of the electromechanical transducer.

Also, the technology disclosed in Japanese Patent Laid-Open No.08-335676 allows crystals to be grown around nuclei and good contact with a PTZ film ensured by forming nuclei of a component element of PZT (titanium) on the bottom electrode, but if iridium alone was used as the bottom electrode and the PZT film was formed by sol-gel method, then there was a problem in that the bottom electrode took in oxygen and swelled in the course of the baking of the PZT film. Because the bottom electrode became hard and brittle if it took in oxygen, the bottom electrode would break if used as an actuator.

The structure that used to be employed when a ferroelectric thin film device was used as an electromechanical transducer had an adhesive layer (buffer layer) of titanium, chromium, or the like provided between the bottom electrode and the surface where this transducer was installed in order to enhance the adhesion between the electromechanical transducer and this installation surface. The inventors of the present invention, however, discovered that in the course of the manufacture of an electromechanical transducer, the element that makes up the adhesive layer, such as titanium, is diffused as a result of heat treatment and moves into the ferroelectric thin film, which diminishes the piezoelectric characteristics of the electromechanical transducer. The reason for this seems to be that the titanium becomes admixed with the ferroelectric thin film and disrupts the stoichiometric ratio in this film, or produces a layer with a low dielectric constant at the interface between the bottom electrode and the ferroelectric thin film.

A ferroelectric thin film has spontaneous polarization, and because the polarization direction can be inverted by the action of an external electrical field, this characteristic can be utilized to manufacture a nonvolatile memory. When a ferroelectric thin film was applied as a memory device, an alloy of platinum and iridium, iridium alone, or iridium oxide was used in the past as a bottom electrode for applying an electrical field to the ferroelectric thin film in an effort to enhance the characteristics of the ferroelectric thin film and prevent their deterioration over time. Examples of such usage are found in U.S. Pat. No. 5,191,510, Japanese Patent Laid-Open No.07-245287, and elsewhere.

However, the bottom electrodes composed of an alloy of platinum and iridium, iridium alone, or iridium oxide that were used for memory devices posed problems when used as electromechanical transducers, such as in an ink jet recording head. Specifically, the electromechanical transducer must itself be deformed with an ink jet recording head, but with a bottom electrode containing iridium, there were problems in that the bottom electrode was too hard and the film stress generated in the bottom electrode was too high. Another problem was poor adhesion between the bottom electrode and the installation surface and between the bottom electrode and the ferroelectric thin film.

Furthermore, the problem of markedly increased leakage current was encountered when iridium was used as the bottom electrode, as discussed in the article "Explanation of the Leakage Mechanism of a PZT Capacitor Deposited on an Ir Electrode (Lecture Summaries from the 59th Convention of the Applied Physics Society, issued Sep. 15, 1998, p. 450). Accordingly, the use of platinum is normally preferred for the bottom electrode when a ferroelectric thin film is used as an actuator for an ink jet recording head.

Platinum is therefore favorable for the bottom electrode of a electromechanical transducer, but there has been a need for a bottom electrode having a structure capable of preventing the admixture of impurities (such as titanium) into the ferroelectric thin film during the electromechanical transducer manufacturing process, and of enhancing the adhesion between the bottom electrode and the installation surface and between the bottom electrode and the ferroelectric thin film.

When an alloy of platinum and iridium was used for the bottom electrode of an electromechanical transducer as disclosed in Japanese Patent Laid-Open No.07-245236, or when iridium oxide was used as disclosed in Japanese Patent Laid-Open No.07-245237, a problem was encountered in that residual stress was generated in the bottom electrode containing iridium in the course of baking and crystallizing the ferroelectric thin film, and this residual stress diminished the characteristics of the electromechanical transducer. For example, the residual stress generated in a bottom electrode could impart strain to the ferroelectric thin film and undesirably lower the percentage of volumetric change.

In view of this, it is an object of the present invention to provide a method for manufacturing a ferroelectric thin film device with which the crystal orientation of a ferroelectric thin film can be controlled as dictated by the intended application of an electromechanical transducer. It is a further object to provide an ink jet recording head whose ink discharge drive source is an electromechanical transducer obtained by this manufacturing method, as well as a method for manufacturing this head, and an ink jet printer that makes use of the same. Another object of the present invention is to provide a nonvolatile ferroelectric memory device in which a ferroelectric thin film device obtained by this manufacturing method serves as a capacitor, and a method for manufacturing this memory device.

Yet another object of the present invention is to provide a method for manufacturing an electromechanical transducer having very reliable drive characteristics when iridium alone is used as the material for the bottom electrode.

Yet another object of the present invention is to provide an electromechanical transducer with which adhesion with the installation surface can be enhanced without diminishing the piezoelectric characteristics, and an ink jet recording head and an ink jet printer that make use of this transducer. Another object of the present invention is to provide a method for manufacturing an electromechanical transducer having a layer structure with which adhesion with the installation surface can be maintained without diminishing the piezoelectric characteristics.

Still another object of the present invention is to provide an electromechanical transducer having good piezoelectric characteristics as a result of reduced residual stress during baking, an ink jet recording head and printer that make use of this electromechanical transducer, and a method for manufacturing an electromechanical transducer.

SUMMARY OF THE INVENTION

With the method of the present invention for manufacturing a ferroelectric thin film device, a bottom electrode film containing at least iridium is formed on a surface preparation layer whose main component is zirconium oxide, and an ultra-thin titanium layer is laminated over this bottom electrode. Next, a crystallized ferroelectric thin film is formed by forming an amorphous layer containing elemental metal and elemental oxygen that constitute a ferroelectric over the titanium layer, and heat treating the amorphous layer. It was confirmed that the orientation of the ferroelectric thin film can be controlled by adjusting the film thickness during the lamination of the titanium layer at this point. For instance, if the thickness of the titanium layer is at least 2 nm and less than 10 nm, the ferroelectric thin film will have a (100) priority orientation, and if this thickness is at least 10 nm and less than 20 nm, the ferroelectric thin film will have a (111) priority orientation.

Therefore, a ferroelectric thin film device that is favorable as a electromechanical transducer used with DC drive or low frequency drive will be obtained by setting the thickness of the titanium layer to at least 10 nm and less than 20 nm, whereas a ferroelectric thin film device that is favorable as a capacitor for a nonvolatile ferroelectric memory device, or an electromechanical transducer that is favorable for high frequency drive will be obtained by setting the thickness of the titanium layer to at least 2 nm and less than 10 nm.

It is preferable for the ferroelectric thin film to be a ferroelectric whose constituent components are at least titanium and lead, and lead titanate zirconate is particularly favorable. It is preferable for the ferroelectric thin film to be formed by sol-gel method. A sol-gel method is preferred in terms of orientation control because the crystallization of the ferroelectric thin film proceeds from the bottom electrode side.

It is also preferable for the bottom electrode to be a single layer of an iridium film or a laminate film having a laminated structure comprising an (iridium layer)/(platinum layer), a (platinum layer)/(iridium layer), or an (iridium layer)/(platinum layer)/(iridium layer), in that order starting at the surface preparation layer.

The ink jet recording head of the present invention comprises an electromechanical transducer obtained by the manufacturing method of the present invention, a pressure chamber whose internal volume is varied by the mechanical displacement of an electromechanical transducer, and discharge outlets that communicate with the pressure chamber and from which ink droplets are discharged. The ink jet printer of the present invention has a printing function comprising the ink jet recording head of the present invention.

In the method of the present invention for manufacturing an ink jet recording head, a surface preparation layer whose main component is zirconium oxide is formed on a silicon substrate surface, either directly or via a diaphragm film, and an electromechanical transducer is formed by the above-mentioned manufacturing method of the present invention over this surface preparation layer. The electromechanical transducer is then separated so as to line up with a position where the mechanical displacement of the electromechanical transducer can be imparted to the pressure chamber.

In the method of the present invention for manufacturing a nonvolatile ferroelectric memory device, there is a step for manufacturing the capacitor of a memory cell by the above-mentioned manufacturing method of the present invention.

The method of the present invention for manufacturing an electromechanical transducer comprises the steps of forming a bottom electrode composed of iridium alone over a surface preparation layer whose main component is zirconium oxide, laminating a titanium layer whose film thickness is at least 15 nm and less than 30 nm over this bottom electrode, and forming a crystallized ferroelectric thin film by forming an amorphous film containing the elemental metal and elemental oxygen that constitute the ferroelectric over said titanium layer and then heat treating this amorphous film.

The oxygen content of the bottom electrode in the course of baking the ferroelectric thin film can be kept to a minimum and an electromechanical transducer with excellent toughness can be provided by adjusting the thickness of the titanium layer laminated over the bottom electrode to within a range of at least 15 nm and no more than 30 nm.

The priority orientation of the ferroelectric thin film can be controlled to the (111) plane or the (110) plane by adjusting the thickness of the titanium layer to within the above range. The step of forming the ferroelectric thin film is preferably a sol-gel process or MOD process.

The electromechanical transducer of the present invention further comprises an adhesive layer formed from an alloy containing an anti-diffusion metal and formed between the bottom electrode and the surface where the transducer is installed, and an anti-diffusion layer formed from an alloy containing the anti-diffusion metal and formed between the bottom electrode and said ferroelectric thin film.

The anti-diffusion metal is selected, for example, from the group consisting of iridium, palladium, rhodium, ruthenium, and osmium. The above-mentioned adhesive layer is, for example, an alloy of the anti-diffusion metal and the metal that constitutes the bottom electrode. The above-mentioned anti-diffusion layer is, for example, an alloy of the anti-diffusion metal and an adhesive metal that is either titanium or chronium. The bottom electrode is made of platinum.

It is preferable for the ferroelectric thin film to be formed in a thickness of at least 1 $\mu$m. The baking treatment must be repeated numerous times for this thickness to be achieved, but the diffusion of the titanium or other adhesive metal is prevented by the anti-diffusion layer of the present invention even though the baking treatment is performed numerous times.

The ink jet recording head of the present invention is constituted by an arrangement of the electromechanical transducers of the present invention on the diaphragm film that forms at least one side of a pressure chamber filled with ink. The diaphragm film is, for example, constituted by the lamination of a silicon oxide film with a zirconium oxide film or the like. The ink jet printer of the present invention is a printer furnished with this ink jet recording head as an ink discharge means.

The method of the present invention for manufacturing an electromechanical transducer comprises the steps of forming an adhesive metal layer composed of an adhesive metal over the surface where the transducer is installed, forming a first anti-diffusion metal layer composed of an anti-diffusion metal over the adhesive metal layer, forming the bottom electrode over the anti-diffusion metal layer, forming a second anti-diffusion metal layer composed of the anti-diffusion metal over the bottom electrode, and baking the ferroelectric thin film while this ferroelectric thin film is formed over the second anti-diffusion metal layer, and thereby diffusing the adhesive metal all the way to the second anti-diffusion metal layer and producing an anti-diffusion layer at the location of the second anti-diffusion metal layer, promoting the alloying of the anti-diffusion metal and the bottom electrode, and producing an adhesive layer at the location of the adhesive metal layer and first anti-diffusion metal layer.

Preferably, a metal selected from the group consisting of iridium, palladium, rhodium, ruthenium, and osmium is used as the anti-diffusion metal. Also, either titanium or chronium is used as the adhesive metal.

The electromechanical transducer of the present invention comprises an interlayer formed from a compound selected from the group consisting of zirconium oxide, tantalum oxide, silicon nitride, and aluminum oxide and formed on the surface where the transducer is installed, and a bottom electrode formed over this interlayer. The bottom electrode comprises a first layer composed of an alloy of iridium and a specific metal and provided over the interlayer, and a second layer containing iridium and provided over the first layer.

This structure is formed when the baking is performed at a relatively low temperature of 750° C. or lower, for example, and there is little movement of the iridium.

The electromechanical transducer in another embodiment of the present invention comprises an interlayer formed from a compound selected from the group consisting of zirconium oxide, tantalum oxide, silicon nitride, and aluminum oxide and formed on the surface where the transducer is installed, and a bottom electrode formed over the interlayer. The bottom electrode comprises a first layer containing a specific metal and provided over the interlayer, and a second layer containing iridium and provided over the first layer.

This structure is formed when the baking is performed at a relatively high temperature of over 750° C., for example, and there is much movement of the iridium.

The above-mentioned second layer is characterized in that the iridium that has diffused from the lower layer side is separated from the iridium present from the outset. An adhesive layer composed of a metal that adheres to both the interlayer and the bottom electrode may also be formed between these layers.

For example, it can be checked that the volumetric ratio in the bottom electrode accounted for by the alloy containing iridium is at least 2/5 and no more than 4/5. The "alloy containing iridium" refers to an alloy of iridium and titanium, oxygen, or the like.

The ink jet printer of the present invention is characterized in that the electromechanical transducer of the present invention is provided as an actuator over the diaphragm film that serves as the installation surface. The ink jet printer is also characterized by comprising this ink jet recording head as a printing means.

The method of the present invention for manufacturing an electromechanical transducer comprises the steps of using a compound selected from the group consisting of zirconium oxide, tantalum oxide, silicon nitride, and aluminum oxide to form an interlayer on the surface where this transducer is installed, forming a bottom electrode over this interlayer, forming a ferroelectric thin film precursor over this bottom electrode, and baking.

Here, the step of forming the bottom electrode comprises the steps of using iridium to form a first iridium layer, using a specific metal to form a metal layer over the first iridium layer, and using iridium to form a second iridium layer over the metal layer, the baking step being a step of forming the ferroelectric thin film precursor and then baking it at a temperature of 750° C. or lower, thereby diffusing the iridium of the first iridium layer and converting the first iridium layer and the metal layer into an alloy layer in which iridium is alloyed with the metal.

The method for manufacturing an electromechanical transducer in another embodiment of the present invention comprises the steps of using a compound selected from the group consisting of zirconium oxide, tantalum oxide, silicon nitride, and aluminum oxide to form an interlayer on the surface where this transducer is installed, forming a bottom electrode over the interlayer, forming a ferroelectric thin film precursor over the bottom electrode, and baking.

Here, the step of forming the bottom electrode comprises the steps of using iridium to form a first iridium layer, using a specific metal to form a metal layer over the first iridium layer, and using iridium to form a second iridium layer over the metal layer.

The baking step is a step of forming the ferroelectric thin film precursor and then baking it at a temperature higher than 750° C., thereby diffusing the iridium of the first iridium layer and moving the iridium of the first iridium layer to the second iridium layer.

Preferably, the ratio of the thickness of the first iridium layer prior to baking to the thickness of the bottom electrode overall is set to be between 1/3 and 4/5. The reason for this is that stress will be moderated more efficiently if the thickness of the iridium layer is within, this range.

The method of the present invention for manufacturing an electromechanical transducer may further comprise the step of using a metal that will adhere to the layers above and below to form an adhesive layer between the bottom electrode and the interlayer.

Here, the step of forming a bottom electrode is a step of forming a film such that the following relationship is satisfied:

$$dT = 3.6 \times d_0 + 2.4 \times d_1 + 0.8 \times d_2 + 2.3 \times d_3$$

when we let $d_o$ be the thickness of said adhesive layer prior to baking, $d_1$ be the thickness of said first iridium layer, $d_2$ be the thickness of said metal layer, $d_3$ be the thickness of said second iridium layer, and dT be the thickness of said bottom electrode overall after baking. The reason for this is that the thickness of the layer after crystallization varies as indicated by the above relationship as a result of baking after formation in this relationship.

BRIEF DESCRIPTION OF THE DRAWINGS

FIG. 4 is a graph of the degree of (111) and (100) orientation of a PZT film when the titanium film thickness is varied;

FIG. 5 is a graph of the piezoelectric constant $d_{31}$ of a PZT film when the titanium film thickness is varied;

DESCRIPTION OF THE PREFERRED EMBODIMENTS

Embodiment 1 of the Invention

This embodiment pertains to a technique in which a ferroelectric thin film device is utilized as an ink discharge drive source (electromechanical transducer) for an ink jet recording head. This embodiment will be described through reference to FIGS. 1 to 7.

Figure 1:
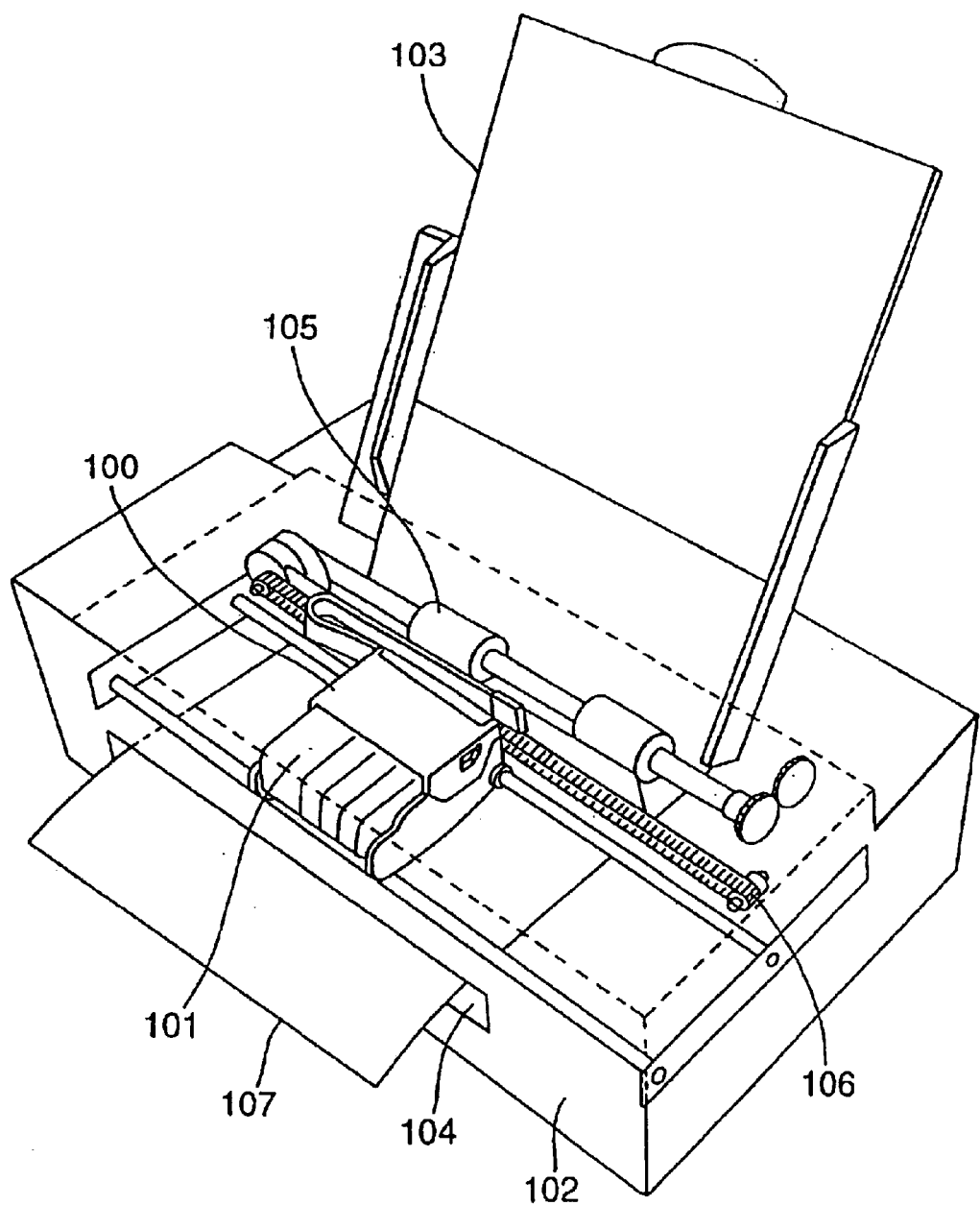
FIG. 1 is a structural diagram of an ink jet printer.

FIG. 1 is a structural diagram of an ink jet printer. The ink jet printer chiefly comprises an ink jet recording head 100, a main unit 102, a tray 103, and a head drive mechanism 106. The ink jet recording head 100 is equipped with ink jet cartridges 101 of four colors: yellow, magenta, cyan, and black, which make full-color printing possible. This ink jet printer is also internally equipped with a dedicated controller port or the like, which controls the timing of ink discharge from the ink jet recording head 100 and the scanning of the head drive mechanism 106, and affords high-precision ink control, half-tone processing, and so on. The main unit 102 is equipped with the tray 103 at its rear, and with an automatic sheet feeder (automatic continuous paper feed mechanism) 105 internally, which automatically feeds out recording paper 107, with this recording paper 107 being discharged from a discharge slot 104 at the front. The recording paper 107 can be ordinary paper, special paper, recommended OHP sheets, glossy paper, glossy film, level sheets, standard-size postcards, or the like.

Figure 2:
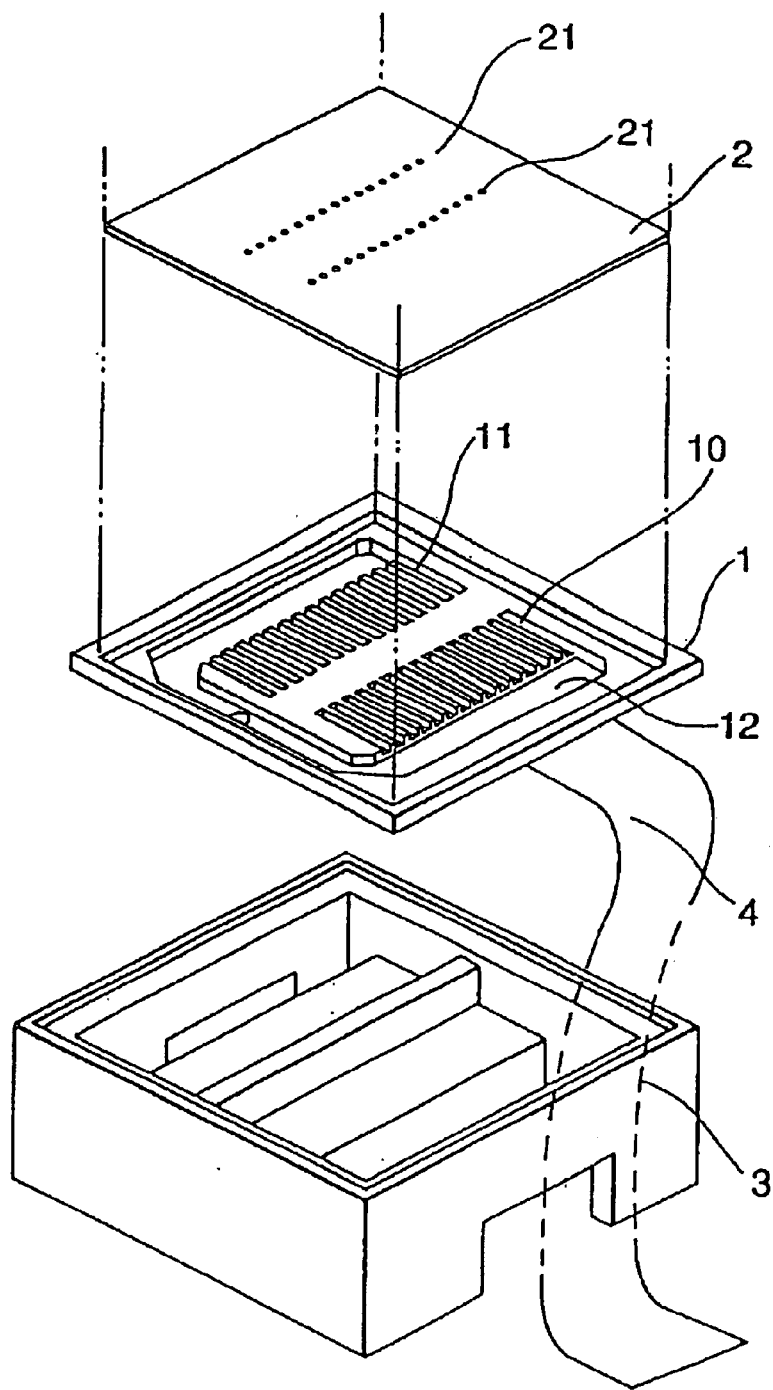
FIG. 2 is an exploded oblique view of an ink jet recording head.

Next, FIG. 2 is an exploded oblique view of an ink jet recording head. The type shown here has a common channel for the ink provided on inside of the pressure chamber substrate. As shown in this figure, the ink jet recording head is constituted by a pressure chamber substrate 1, a nozzle plate 2, and a base 3. On the pressure chamber substrate 1, a silicon monocrystalline substrate is etched, after which are separated from one another. A plurality of slender pressure chambers 10 are provided to the pressure chamber substrate 1, and a common channel 12 for supplying ink to all of the pressure chambers (cavities) 10 is provided. Side walls 11 are erected between the pressure chambers 10 to keep them apart. Electromechanical transducers are attached as ink discharge drive sources to the base 3 of the pressure chamber substrate 1. These electromechanical transducers are ferroelectric thin film devices manufactured according to the method of the present invention, and are devices for converting electrical energy into mechanical energy. These transducers are also called piezoelectric actuators or microdisplacement control devices. The wiring from the various electromechanical transducers is bundled on a wiring board 4 which is a flexible cable, and is controlled by a print engine component.

The nozzle plate 2 is laid over the pressure chamber substrate 1. Nozzles (discharge ports) 21 for discharging ink droplets are formed at locations corresponding to the pressure chambers 10 in the nozzle plate 2. The nozzles 21 are arranged in rows that are more or less parallel to the main scanning direction of the ink jet recording head during printing, and the pitch between the nozzles is suitably set according to the printing precision. For instance, if the resolution is set at 1440×720 dpi, the nozzle diameter will be extremely fine, and high-precision printing with ultra-fine ink dots will be possible. The number of nozzles of each color is determined according to the color printing precision; for instance, there can be 32 black nozzles and 32 nozzles of each color. The base 3 is molded from plastic or the like, and serves as an attachment stand for the pressure chamber substrate 1.

Figure 3A:
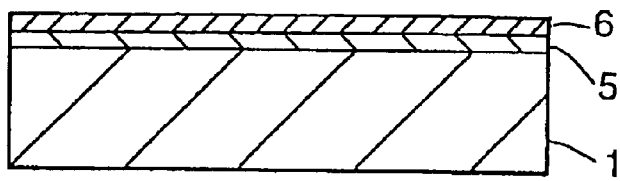
FIGS. 3A to 3F are cross sectional diagrams of the main steps for manufacturing an ink jet recording head.
Figure 3B:
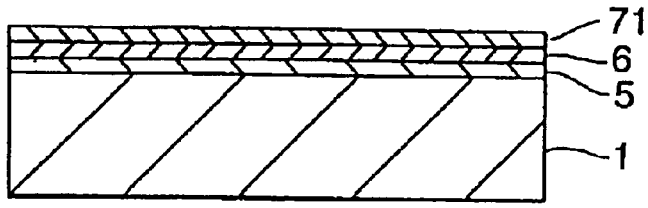
Figure 3C:
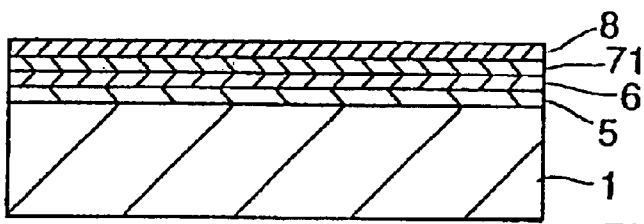
Figure 3D:
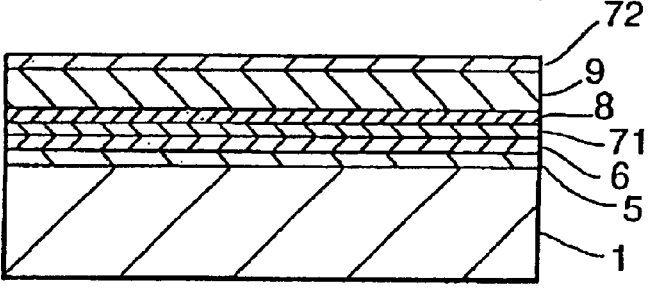
Figure 3E:
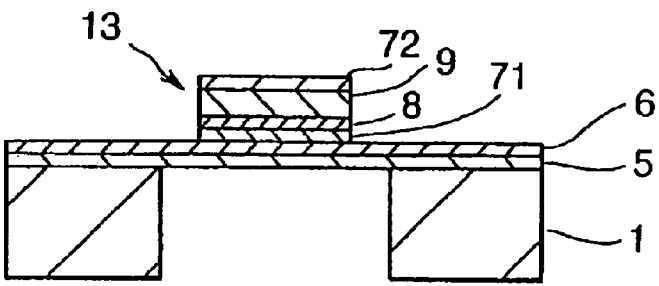
Figure 3F:
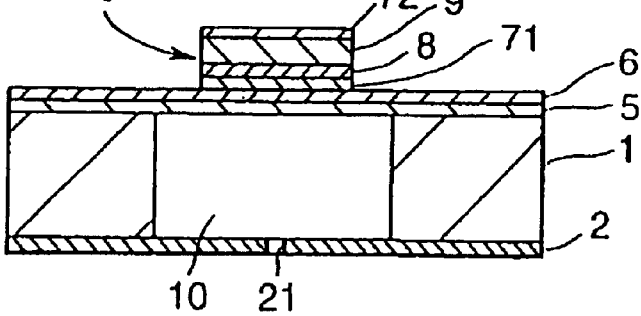

FIG. 3F is a cross sectional diagram of the main components of the ink jet recording head. The pressure chamber 10 is formed by etching in the pressure chamber substrate 1. The electromechanical transducer 13 is formed on top of the pressure chamber 10 via a diaphragm film 5 and a surface preparation layer 6. The mechanical displacement of the electromechanical transducer 13 changes the internal volume of the pressure chamber 10 and discharges the ink contained in the pressure chamber 10 from the nozzle 21. The purpose of the surface preparation layer 6 is to prepare the surface for the formation of the electromechanical transducer 13, and plays a particularly important role in the orientation of the ferroelectric thin film of the present invention. The role of the surface preparation layer 6 will be discussed in more detail below. The electromechanical transducer 13 comprises a bottom electrode 71, a titanium layer 8, a ferroelectric thin film 9, and an top electrode 72. The ferroelectric thin film 9 is subjected to a (111) priority orientation treatment for the (111) plane or the (100) plane by the manufacturing method of the present invention.

A ferroelectric having at least titanium and lead as its constituent components is preferable as the type of the ferroelectric thin film 9. Favorable examples include lead titanate ($PbTiO_3$), lead titanate zirconate ($Pb(Zr,Ti)O_3$), lead lanthanum titanate (($Pb,La),TiO_3$), lead lanthanum titanate zirconate (($Pb,La)(Zr,Ti)O_3$), and lead zirconium-titanate magnesium-niobate ($Pb'(Zr,Ti)(Mg,Nb)O_3$). Lead titanate zirconate (PZT) is particularly favorable.

The bottom electrode 71 either consists of a single layer of iridium film, or has a laminated structure comprising an (iridium layer)/(platinum layer), a (platinum layer)/(iridium layer), or an (iridium layer)/(platinum layer)/(iridium layer), in that order starting at the surface preparation layer 6. An alloy of iridium and platinum is also acceptable. The lattice constant of the ferroelectric thin film 9 can be matched by increasing or decreasing the iridium and platinum proportional contents. There are no particular restrictions on the top electrode 72 as long as it is a conductive material that can be used as an ordinary electrode, but examples include Pt, $RuO_2$, $IrO_2$, and other single-layer films, or Pt/Ti, Pt/Ti/TiN, Pt/TiN/Pt, Ti/Pt/Ti, TiN/Pt/TiN, Pt/Ti/TiN/Ti, $RuO_2$/TiN, $IrO_2$/Ir, $IrO_2$/TiN, and other laminated films of two or more layers. An ultra-thin titanium thin film, a chromium thin film, or another suitable buffer layer may be interposed between the surface preparation layer 6 and the bottom electrode 71 in order to increase the adhesive strength therebetween. It is also possible to use a structure in which the diaphragm film 5 is omitted and the surface preparation layer 6 doubles as a diaphragm film. Also, while not shown in the figure, a passivation film can be used to cover the electromechanical transducer 13 and the entire surface preparation layer 6 that is exposed on the surface. A fluororesin, silicon oxide film, epoxy resin, and the like are favorable as this passivation film.

Working Example

The steps for manufacturing the electromechanical transducer in this embodiment will now be described, along with the main steps for manufacturing an ink jet recording head, through reference to FIG. 3. First, as shown in FIG. 3A, a diaphragm film 5 and a surface preparation layer 6 were formed on a pressure chamber substrate 1. A silicone monocrystalline substrate with a diameter of 100 mm and a thickness of 220 $\mu$m was used, for example, as the pressure chamber substrate 1. For the diaphragm film 5, dry oxygen was allowed to flow into a 1100° C. furnace to conduct thermal oxidation for about 22 hours, forming a thermal oxidation film with a thickness of approximately 1 $\mu$m. Alternatively, a film may be formed by suitably choosing another formation method such as CVD. The diaphragm film 5 is not limited to a silicon dioxide film, and may instead be a zirconium oxide film, a tantalum oxide film, a silicon nitride film, or an aluminum oxide film. Next, in order to form a film of zirconium oxide ($ZrO_2$) as the surface preparation layer 6, a film was formed in a thickness of about 400 nm by reactive sputtering involving the introduction of oxygen gas and using zirconium as the target. Other film formation methods may be used instead, such as forming a film by RF sputtering with a zirconium oxide target, or forming a film of zirconium by DC sputtering and then subjecting this film to thermal oxidation.

Next, a bottom electrode 71 was formed over the surface preparation layer 6 (FIG. 3B). This bottom electrode 71 had a laminate structure comprising platinum/iridium (starting from the surface preparation layer 6 side), with each film being about 100 nm thick. Alternatively, the laminate structure may comprise iridium/platinum or iridium/platinum/iridium (from the surface preparation layer 6 side), or a film may be formed by sputtering using iridium alone as the target. In the step of heat treating the ferroelectric thin film discussed below, part of the iridium is oxidized, forming an iridium oxide layer between columnar crystals of platinum. This iridium oxide prevents the oxygen from escaping from the ferroelectric thin film, and thereby prevents the characteristics of the ferroelectric thin film from deteriorating.

A titanium layer 8 was then laminated over the bottom electrode 71 (FIG. 3C). DC magnetron sputtering was utilized to form the titanium layer 8, with the thickness ranging between 2 and 10 nm. The reason for keeping the thickness within this range will be discussed below. CVD, vapor deposition, or another such film formation process can also be used to form the titanium layer 8.

Next, a ferroelectric thin film 9 and top electrode 72 were formed over the titanium layer 8 (FIG. 3D). In this embodiment, a PZT film was formed by sol-gel method as the ferroelectric thin film 9. A sol-gel method generally involves subjecting an organometal compound such as a metal alkoxide to hydrolysis in a solution system, conducting polycondensation to grow metal-oxygen-metal bonds, and finally baking this to complete the production of an inorganic oxide. An advantage of a sol-gel method is that it yields a uniform film at a low substrate temperature. Furthermore, adhesion to the substrate is excellent because the film is formed from a solution. In particular, with the present invention, when the ferroelectric thin film is formed by sol-gel method, crystallization will proceed successively from the bottom electrode side toward the top electrode side, so control of orientation is superior. In specific terms, the substrate is coated with a solution containing an organometal compound, and the coating is dried and then baked. Examples of organometal compounds that can be used include metal methoxides, ethoxides, propoxides, butoxides, and other such alkoxides that constitute an inorganic oxide, and acetate compounds. Nitrates, oxalates, perchlorates, and other such inorganic salts may also be used. To produce an inorganic oxide from these compounds, it is necessary to promote hydrolysis and polycondensation reactions, and therefore water must be added to the coating solution. The amount added will vary with the system, but if too large, the reaction will proceed too quickly and the resulting film will tend to be uneven, and it will also be difficult to control the reaction velocity. The reaction will also be difficult to control if the amount of added water is too small, so the proper amount should be used. The reaction velocity and reaction form can be controlled by adding a hydrolysis acceleration catalyst, or a chelating agent coordinated to the metal atoms. Common acids and bases can be used as hydrolysis acceleration catalysts. The film quality will be greatly affected by the type of catalyst. Examples of chelating agents include acetylacetone, ethyl acetoacetate, and diethyl malonate. The solvent should be one in which the above-mentioned materials will not precipitate, that is, one with excellent miscibility. The solution concentration will vary with the coating method, but in the case of spin coating, the solution viscosity should be adjusted to between a few centipoise and a few dozen centipoise. Removal of organic matter and crystallization will be promoted by baking the film coating. The baking temperature will vary with the material, but can be lower than that used in the baking of ordinary metal oxide powders.

In this embodiment, a mixed solution of $Pb(CH_3COO)_2 \cdot 3H_2O$, $Zr(t-OCH_4H_9)_4$, and $Ti(i-OC_3H_7)_4$ was readied as the starting raw material for the PZT film. This mixed solution was applied by spin coating at 1500 rpm in a thickness of 0.1 $\mu$m, and degreasing was performed at a temperature of 400° C. This step was repeated five times, which yielded a gel with a film thickness of 0.5 $\mu$m. Finally, crystallization was effected by RTA (Rapid Thermal Annealing). This treatment was conducted for 5 minutes at 650° C. The ferroelectric thin film 9 was obtained in a thickness of 0.5 $\mu$m through this process. When a ferroelectric thin film device is used as an electromechanical transducer, the ferroelectric thin film is also called a piezoelectric film. Next, a film of platinum was formed by DC sputtering in a thickness of 100 nm as the top electrode 72 over the ferroelectric thin film 9.

Next, the top electrode 72 was spin-coated with a resist, and this product was exposed and developed at the locations where the pressure chambers were to be formed, thereby producing a pattern. Using the remaining resist as a mask, the top electrode 72, ferroelectric thin film 9, titanium layer 8, and bottom electrode 71 were etched, and the electromechanical transducer 13 was separated so as to correspond to the position where the pressure chamber was to be formed (FIG. 3E). An etching mask was then applied over the position where the pressure chamber was to be formed, and dry etching was performed using an active gas such as a parallel plate type of reactive ion etching gas, which etched the pressure chamber substrate 1 down to a predetermined depth and formed the pressure chamber 10 (FIG. 3E). The remaining unetched portion became the side walls 11. The etching of the pressure chamber substrate 1 can also be accomplished by wet etching using a high-concentration alkali aqueous solution, such as a 5 to 40 wt % potassium hydroxide aqueous solution.

Finally, as shown in FIG. 3F, a resin or the like was used to join the nozzle plate 2 to the pressure chamber substrate 1. The nozzles 21 can be formed by making holes at specific locations in the nozzle plate 2 by lithography, laser working, FIB working, discharge working, or the like. In the joining of the nozzle plate 2 to the pressure chamber substrate 1, the nozzles 21 were positioned so that they corresponded to the spaces of the various pressure chambers 10. The ink jet recording head was completed by attaching the pressure chamber substrate 1 and the joined nozzle plate 2 to the base 3.

The inventors measured the degree of orientation (%) of the (100) and (111) planes of the ferroelectric thin film 9 (PZT film) formed by the above manufacturing process with respect to changes in the thickness of the titanium layer 8. The measurement results are given in FIG. 4. The degree of orientation of the planes here is defined as the proportional diffraction intensity of the (100) plane, the (110) plane, and the (111) plane when the sum of the diffraction intensities of these planes is 100. As shown in the figure, the proportional orientation of the (111) plane was 15 to 45% when the thickness of the titanium layer 8 was within a range of 2 to 10 nm, but was 45 to 90% within a range of 10 to 20 nm. Meanwhile, the proportional orientation of the (100) plane was 40 to 90% when the thickness of the titanium layer 8 was within a range of 2 to 10 nm, but was 5 to 40% within a range of 10 to 20 nm.

It can be seen from the above results that when a ferroelectric thin film device is used as an electromechanical transducer, in a low-frequency drive band, the preferred range is one in which the (111) plane is the priority orientation, that is, a range in which the thickness of the titanium layer 8 is 10 to 20 nm. On the other hand, it can be seen that when this device is used as an electromechanical transducer in a high-frequency drive band, or when a ferroelectric thin film device is used as a capacitor for a FRAM, DRAM, or other such memory device, the preferred range is one in which the (100) plane is the priority orientation, that is, a range in which the thickness of the titanium layer 8 is 2 to 10 nm.

Applications of the present invention are not, however, limited to those given above, and a suitable orientation should be chosen according to the frequency that will be used. For example, when an electromechanical transducer is used as an ink jet recording, head, the {100} priority orientation probably should be about 70% and the {111} priority orientation about, 30% with a drive frequency band of about 14 kHz or 28 kHz (high frequency band). Here, the degree of orientation is expressed as $I(XYZ)/\{I(100)+I(110)+I(111)\}$ when we let $I(XYZ)$ express the reflection intensity of the planar orientation (XYZ) plane of the ferroelectric thin film as measured by wide-angle XRD.

The inventors further measured the change in the piezoelectric constant $d_{31}$ of the ferroelectric thin film 9 (PZT film) with respect to changes in the thickness of the titanium layer 8. The measurement was conducted using DC drive, the results of which are given in FIG. 5. As shown in this figure, when the thickness of the titanium layer 8 was between 2 and 10 nm, the piezoelectric constant $d_{31}$ was 170 pC/N to 200 N, and when the thickness of the titanium layer 8 was between 10 and 20 nm, the piezoelectric constant $d_{31}$ was 200 pC/N to 220 pC/N. It was confirmed from the above results that when an electromechanical transducer is driven by DC, the piezoelectric characteristics will be superior when the thickness of the titanium layer 8 is 10 to 20 nm.

Figure 6:
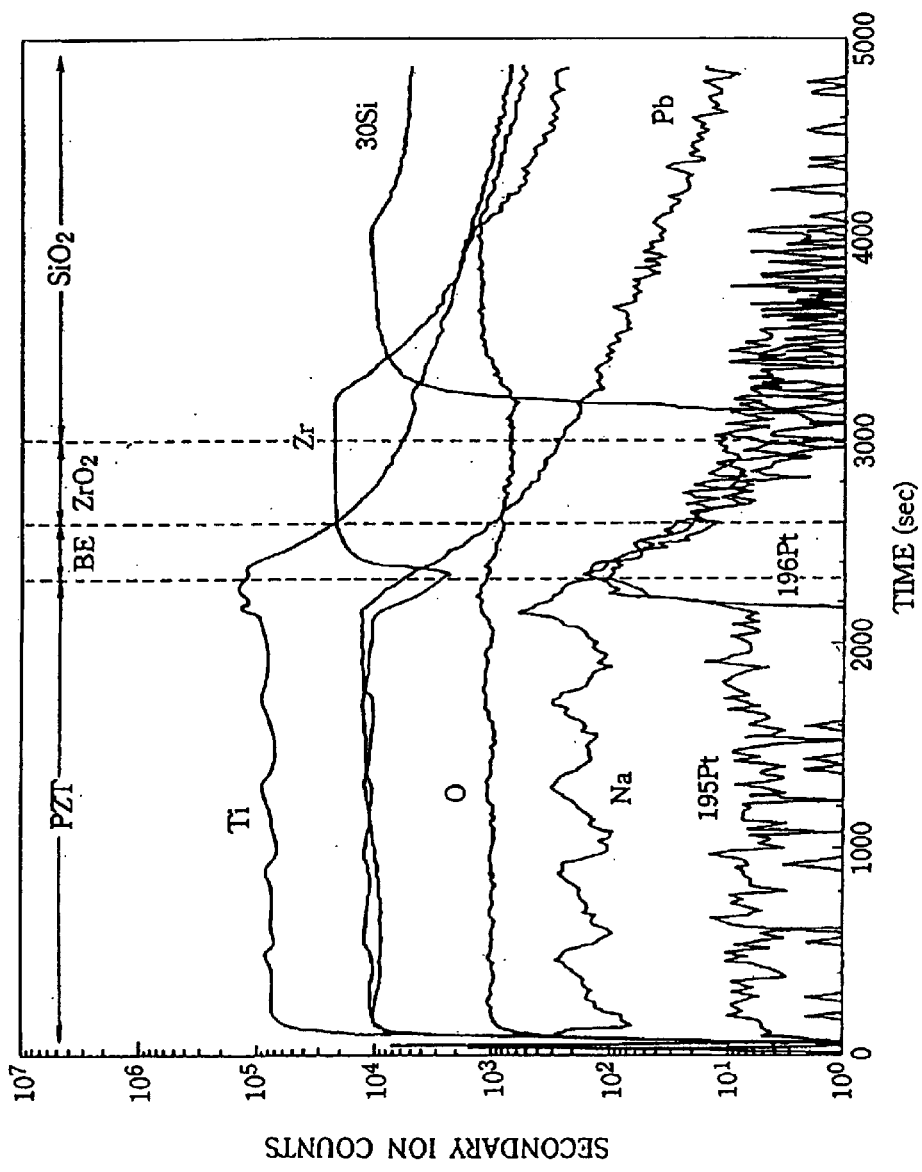
FIG. 6 is a graph of the distribution of the constituent elements in the film thickness direction of an electromechanical transducer.
Figure 7:
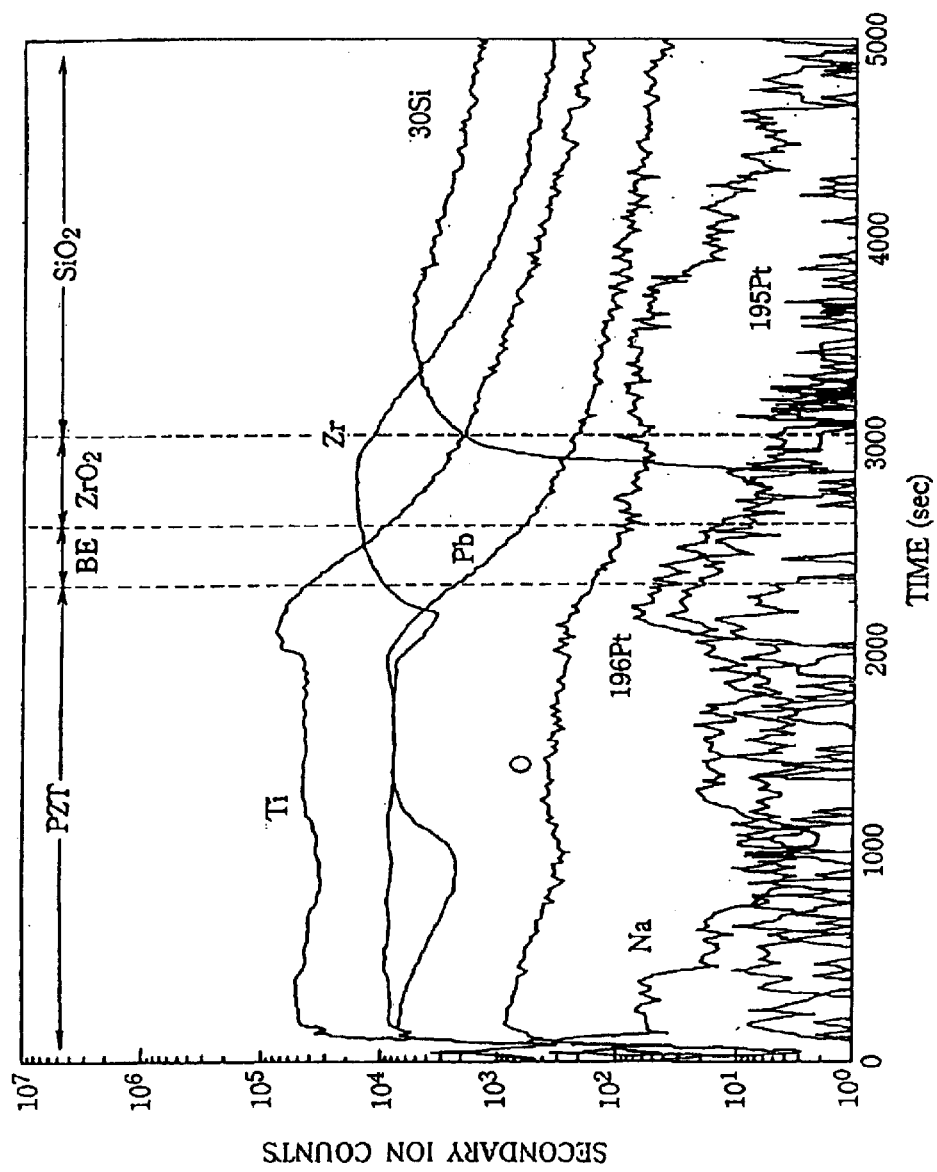
FIG. 7 is a graph of the distribution of the constituent elements in the film thickness direction of an electromechanical transducer.

The inventors also measured by SIMS analysis the distribution of the various component elements in the thickness direction of the electromechanical transducer 13 manufactured by the above manufacturing process. The measurement results are given in FIGS. 6 and 7. FIG. 6 is the measurement results when the thickness of the titanium layer 8 was 10 nm, and FIG. 7 is the measurement results when the thickness of the titanium layer 8 was 20 nm. The horizontal axis denotes time, but since the electromechanical transducer 13 was measured in the depth direction by SIMS analysis, this axis actually denotes the various layers in the film thickness direction, namely, the PZT film (ferroelectric thin film 9)/BE (bottom electrode 71)/$ZrO_2$ (surface preparation layer 6)/$SiO_2$ (diaphragm film 5). The titanium layer 8 is at the interface between the PZT film and the bottom electrode. The vertical axis denotes the amounts of element distribution. As can be seen from these figures, the distribution of titanium (Ti) is nearly average in the film thickness direction within the PZT film, with the distribution amount increasing in the vicinity of the bottom electrode. It seems that the titanium layer 8 laminated over the bottom electrode 71 serves as a nucleus for the crystallization of the PZT film, promoting crystallization.

The reason is not clear why the ferroelectric thin film 9 has a (111) priority orientation if the thickness of the titanium layer 8 is 10 to 20 nm. The inventors conducted experiments into this, but they have yet to discover a film with which the above-mentioned effect can be obtained on any surface preparation layer other than a zirconium oxide film. It therefore seems likely that a zirconium oxide film has some kind of effect in terms of controlling the orientation of a ferroelectric thin film. Nor could they obtain the above-mentioned effect with elements other than titanium, such as the other elements that constitute a ferroelectric, including lead and zirconium. They have yet to find a film having the same function as the titanium layer 8. On the other hand, they confirmed that the (111) priority orientation and (100) priority orientation can be controlled by setting the thickness of the titanium layer 8 to within the above-mentioned range, regardless of the thickness of the ferroelectric thin film 9 or that of the top electrode 72.

The inventors have also confirmed that the above-mentioned effect can be obtained in an MOD (Metal Organic Decomposition) process. They were unable, however, to obtain this effect with other film formation methods besides a sol-gel method, although they attempted to control the orientation of a PZT film by sputtering, laser ablation, and CVD. Whereas the crystallization of a PZT film gradually proceeds from the bottom electrode side toward the top electrode side with a sol-gel or MOD process, the crystallization of the PZT film proceeds at random with CVE, sputtering, and so on, and the resulting lack of regularity in crystallization seems to be one likely cause of the difficulty in controlling orientation.

The orientation of a PZT film can be controlled with this embodiment without any special manufacturing equipment being required. Furthermore, the only difference from a conventional process for manufacturing an electromechanical transducer is the addition of a lamination process for the surface preparation layer and the titanium layer, so the orientation of a PZT film can be controlled by a simple means.

Embodiment 2 of the Invention

A ferroelectric thin film has an extremely large dielectric constant, ranging from a few hundred to a few thousand, and when used for the insulating film of a capacitor, the resulting capacitor has a small surface area and large capacity that are favorable for circuits of large-scale integration. A ferroelectric thin film has spontaneous polarization, and because the polarization direction can be inverted by the action of an external electrical field, this characteristic can be utilized to manufacture a nonvolatile memory. An FRAM in which a ferroelectric thin film such as this is used as the capacitor insulating film has numerous advantages over a conventional nonvolatile memory, such as better nonvolatility, higher operating speed, lower energy consumption, and more rewrites.

This embodiment pertains to a technique in which a ferroelectric thin film device is utilized as a capacitor for an FRAM memory cell. In specific terms, a film of zirconium oxide is formed as the surface preparation layer of the capacitor, and a bottom electrode, titanium thin film, ferroelectric thin film, and top electrode are formed in that order over this film. As discussed above, the ferroelectric thin film can be set to a (100) priority orientation and a film that is favorable as a capacitor insulating film can be obtained by setting the thickness of the titanium thin film to about 2 to 10 nm. The steps for manufacturing a FRAM memory cell will now be described through reference to FIG. 8.

Working Example

Figure 8A:
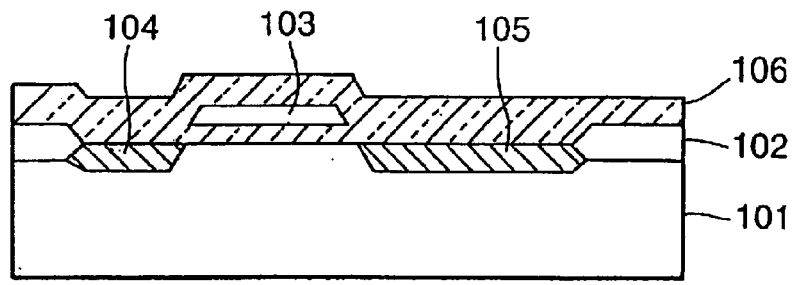
FIGS. 8A to 8D are cross sectional diagrams of the steps for manufacturing an FRAM memory cell.

As shown in FIG. 8A, a nitride film ($Si_3N_4$) was formed over the entire surface of a silicon substrate 101, after which holes were made by photoetching in that portion of the nitride film where the active region was to be formed. The exposed portion of the silicon substrate 101 was oxidized by wet oxidation using steam, thereby forming a LOCOS (LOCal oxidation of Silicon) 102. The unnecessary nitride film was then removed, after which a gate oxidation film with a thickness of 150 Å was formed by HCl oxidation. Polycrystalline silicon was deposited on the substrate surface by the pyrolysis of monosilane ($SiH_4$), and phosphorus (P) was ion-implanted at a concentration of about $10^{21}/cm^3$. After this, this polycrystalline silicon was worked as shown in FIG. 8A by photoetching and by dry etching using $CF_4$ gas or the like, thereby forming a gate electrode 103. The gate electrode 103 was then masked and arsenic (As) was ion-implanted, forming a source region 104 and a drain region 105 through self-alignment. Further, phosphate glass was deposited by CVD, forming an interlayer insulating film 106.

Figure 8B:
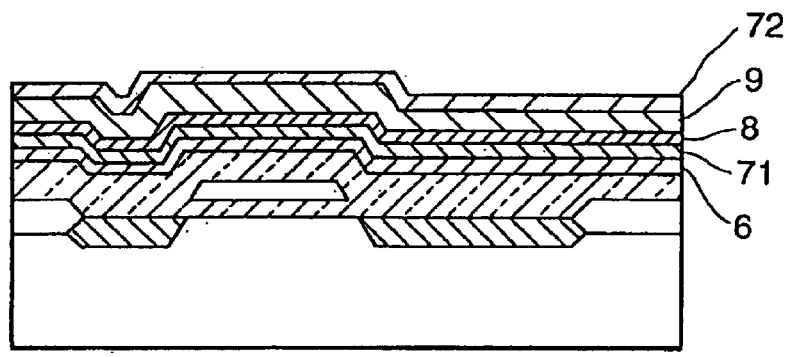

Then, as shown in FIG. 8B, the surface preparation layer 6, bottom electrode 71, titanium layer 8, ferroelectric thin film 9, and top electrode 72 were formed in that order over the interlayer insulating film 106. Zirconium oxide was formed by sputtering in a thickness of 200 nm as the surface preparation layer 6, and a laminate structure of platinum/iridium in a film thickness of 100 nm each was formed as the bottom electrode 71. The titanium layer 8 was then formed in a thickness of 2 to 10 nm by DC sputtering over the bottom electrode 71. Further, a PZT film was formed by sol-gel method in a thickness of 0.2 μm as the ferroelectric thin film 9. This ferroelectric thin film 9 functions as a capacitor insulating film.

Figure 8C:
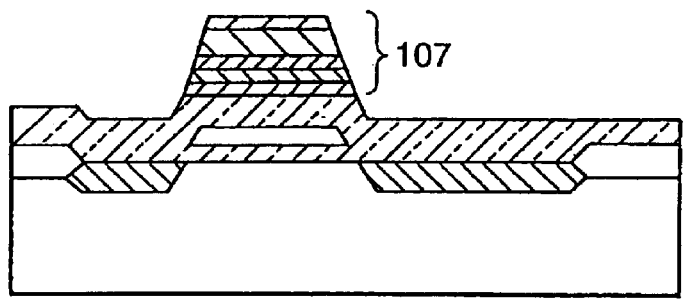
Figure 8D:
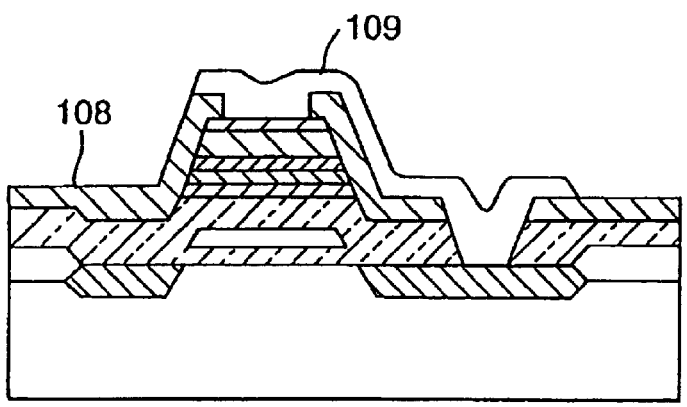

Next, as shown in FIG. 8C, the laminate structure comprising the top electrode 72, the ferroelectric thin film 9, the titanium layer 8, the bottom electrode 71, and the surface preparation layer 6 was etched by ion milling, thereby forming a capacitor 107 over the gate electrode 103 via the interlayer insulating film 106. Phosphate glass was deposited by plasma CVD of tetraethyl orthosilicate (TEOS) as an interlayer insulating film 108, and contact holes communicating with the top electrode 72 and the drain region 105 were made, after which aluminum wiring 109 was formed by DC sputtering, photoprocessing, and an aluminum etching process. The source region 104 of the FRAM memory cell obtained by the above manufacturing process was connected to a bit line, and the gate electrode 103 was connected to a word line. The top electrode 72 was connected to a drive line.

The orientation of a capacitor insulating film can be controlled with this embodiment without any special manufacturing equipment being required. Furthermore, the only difference from a conventional process for manufacturing an FRAM memory cell is the addition of a lamination process for the surface preparation layer and the titanium layer, so the orientation of a capacitor insulating film can be controlled by a simple means.

Embodiment 3 of the Invention

This embodiment pertains to a technique for manufacturing a ferroelectric thin film device in which iridium alone is used for the bottom electrode. With this embodiment, a bottom electrode composed of iridium alone is formed over a surface preparation layer composed of zirconium oxide. A titanium layer (titanium nucleus), which is the element that constitutes the ferroelectric thin film (piezoelectric film), is then laminated over the bottom electrode, and the thickness of the titanium layer is adjusted to about 15 to 30 nm, which prevents the admixture of oxygen into the bottom electrode during the baking of the ferroelectric thin film in a sol-gel method.

Working Example

The steps for manufacturing the electromechanical transducer are more or less the same as the electromechanical transducer manufacturing steps-described in Embodiment 1, and the following description will focus on the differences.

First, as shown in FIG. 3A, a diaphragm film 5 composed of a silicon dioxide film was formed in a thickness of 1 μm over the surface of a pressure chamber substrate 1 with a thickness of 220 μm, over which a surface preparation layer 6 composed of a zirconium oxide film was laminated in a thickness of 400 nm. Then, in order to enhance the adhesion between the surface preparation layer 6 and the bottom electrode 71, an adhesive layer (not shown in the figure) composed of titanium was formed in a thickness of about 10 nm over the surface preparation layer 6.

A bottom electrode 71 was then formed from iridium alone by sputtering in a thickness of about 200 nm (FIG. 3B), after which a titanium layer 8 was formed in a thickness of 20 nm (FIG. 3C). Then, as shown in FIGS. 3D, E, and F, a ferroelectric thin film 9 was formed by sol-gel method, a top electrode 72 was formed by sputtering, and the laminate structure of these thin films was then etched, which separated the electromechanical transducers according to the pressure chambers. The pressure chamber substrate 1 was etched to form the pressure chambers 10, and the nozzle plate 2 was joined.

Table 1 shows the various characteristics of an electromechanical transducer obtained by the above manufacturing process (present example) and an electromechanical transducer obtained by conventional manufacturing process (conventional example). In both cases, the thickness of the surface preparation layer 6 is 400 nm, the thickness of the adhesive layer is 10 nm, and the thickness of the bottom electrode 71 (iridium electrode) is 200 nm. The thickness of the ferroelectric thin film 9 of the electromechanical transducer in the present example is 20 nm, while the thickness of the titanium layer 8 of the electromechanical transducer in the conventional example is 5 nm.

TABLE 1

| PZT crystal orientation | Present example mixture of (111) plane and (110) plane | Conventional example mixture of (111) plane and (110) plane |
|---|---|---|
| Thickness of bottom electrode after baking | 210 nm | 440 nm |
| Piezoelectric constant | 142 pC/N | 145 pC/N |
| Young's modulus of bottom electrode | 300 Gpa | 250 Gpa |
| Breakage rate during head drive | 0% | 7% |

Based on the above results, the thickness of the bottom electrode 71 more than doubled in the conventional example, whereas the thickness of the bottom electrode 71 only increased to 10 nm in the present example. The cause of this seems to be that oxygen is taken into the bottom electrode 71 in the step of baking the ferroelectric thin film 9 in the conventional example, which increases the thickness of the bottom electrode 71, whereas in the present example the oxygen content in the bottom electrode 71 is suppressed by the titanium layer 8 formed in a thickness of 20 nm over the bottom electrode 71. Similar results were also obtained when the thickness of the titanium layer 8 formed over the bottom electrode 71 was between 15 and 30 nm. In addition to the sol-gel method, the ferroelectric thin film 9 can also be formed by MOD process.

The bottom electrode 71 becomes hard and brittle if it contains oxygen, so the electromechanical transducer may break when used as an actuator. As can be seen from the breakage rate for the electromechanical transducers during head drive, which is given in the above table, the rate was 7% in the conventional example, whereas it was 0% in the present example. It was also confirmed that the Young's modulus of the bottom electrode was higher in the present example.

Due to the effect of the titanium layer 8 laminated over the bottom electrode 71, the ferroelectric thin film 9 was a mixture of (111) plane orientation and (110) plane orientation, which differs from the mixture of (111) plane orientation and (100) plane orientation obtained with the conventional manufacturing method.

With the embodiment described above, the oxygen content in the bottom electrode can be minimized during the baking of the ferroelectric thin film by sol-gel method or MOD process by laminating a titanium layer in a thickness of 15 to 30 nm over a bottom electrode composed of iridium alone, which means that the bottom electrode will exhibit better toughness, and an actuator with superior reliability can be realized.

Embodiment 4 of the Invention

This embodiment relates to the bottom electrode of an electromechanical transducer with which adhesion to the installation surface can be enhanced without compromising the piezoelectric characteristics.

Figure 9:
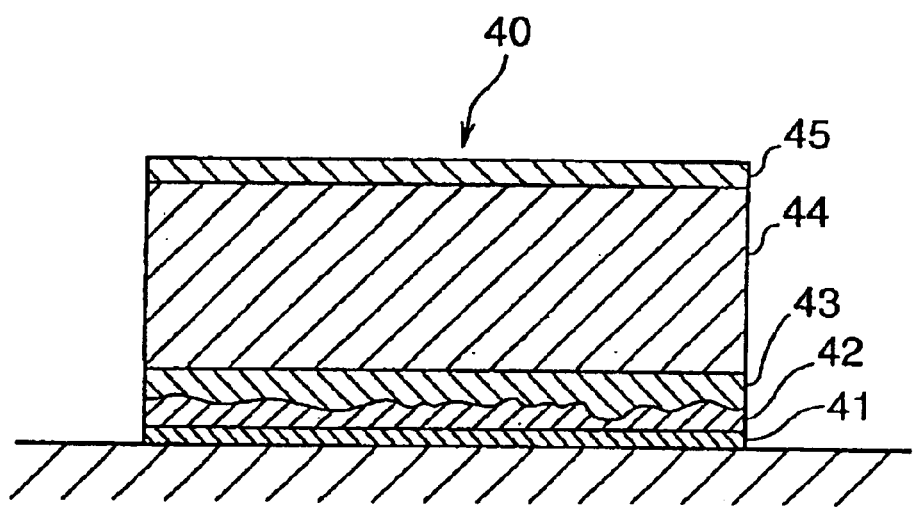
FIG. 9 is a cross sectional diagram of an electromechanical transducer.

FIG. 9 is a cross sectional diagram illustrating the layer structure when the electromechanical transducer pertaining to this embodiment is formed over an installation surface. As shown in the figure, an electromechanical transducer 40 is produced by the successive lamination of an adhesive layer 41, a bottom electrode 42, an anti-diffusion layer 43, a ferroelectric thin film (piezoelectric film) 44, and a top electrode 45 over the installation surface. There are no particular restrictions on the installation surface, but in this embodiment it corresponds to the diaphragm of an ink jet recording head (for instance, a silicon oxide film or a laminate structure of a silicon oxide film layer and a zirconium oxide film).

The adhesive layer 41 is manufactured by the method of the present invention for manufacturing an electromechanical transducer, and is formed from an alloy containing an anti-diffusion metal. This anti-diffusion metal is selected, for example, from the group consisting of iridium (Ir), palladium (Pd), rhodium (Rh), ruthenium (Ru), and osmium (Os). A characteristic of these metals is that they prevent the movement of metals such as titanium and chromium, which are readily diffused by heat, along the grain boundaries of the crystal grains of the above metals. The main component of the adhesive layer 41 is an alloy of the above-mentioned anti-diffusion metal and the metal that constitutes the bottom electrode. Because platinum is used for the bottom electrode in this embodiment, the adhesive layer is an alloy of platinum and the above-mentioned anti-diffusion metal. However, a small amount of the adhesive metal formed at the outset, such as titanium or chromium, remains at the location of this adhesive layer. Specifically, this adhesive layer 41 is not a layer whose composition stays constant from when it is first formed, and is instead a layer produced as a result of the movement of elements occurring in the course of the heat treatment step. The thickness of the adhesive layer 41 is equal to the combined thickness of the adhesive metal layer applied prior to the heat treatment and the first anti-diffusion metal layer.

The bottom electrode 42 is one of the electrodes used to apply voltage to the ferroelectric thin film 44, and is formed from a conductive material, such as platinum (Pt), in a thickness of about 0.4 µm. With a conventional product, the thickness had to be over 0.5 µm because of the movement of the adhesive metal through this bottom electrode, but with this embodiment the anti-diffusion metal plays this role, so the film can be 0.2 µm thinner than in the past. The top electrode 45 is the other electrode for applying voltage to the ferroelectric thin film 44, and is formed from a conductive material, such as platinum (Pt), in a thickness of about 0.1 µm.

The anti-diffusion layer 43 is formed from an alloy of an anti-diffusion metal and an adhesive metal. The anti-diffusion metal is the same as above, and is selected, for example, from the group consisting of iridium, palladium, rhodium, ruthenium, and osmium. The adhesive metal is formed as an adhesive metal layer prior to heat treatment, and is either titanium or chromium, for example. The anti-diffusion layer 43 is a layer in which a second anti-diffusion metal layer formed from an anti-diffusion metal prior to heat treatment is alloyed with the adhesive metal that has come through from the adhesive metal layer, and thereby forms crystals. The function of the second anti-diffusion metal layer, which is the forerunner to this anti-diffusion layer 43, is to prevent the adhesive metal from diffusing into the ferroelectric thin film 44 during the heat treatment step, and to prevent the lead or oxygen present in the ferroelectric thin film 44 from escaping into the bottom electrode 42 during the heat treatment step. The anti-diffusion layer 43 is thus formed by the movement of elements, so the thickness thereof varies according to the amounts in which the second anti-diffusion metal layer and the adhesive metal layer are formed prior to the heat treatment. For instance, there will be minute fluctuations depending on the size of the crystal grains composed of an alloy of anti-diffusion metal and adhesive metal.

The ferroelectric thin film 44 consists of crystals of an ordinary piezoelectric ceramic. Favorable examples include a ferroelectric piezoelectric material such as lead titanate-zirconate (PZT), or the product of adding to this a metal oxide such as magnesium oxide or nickel oxide, or niobic acid. The composition of the ferroelectric thin film 44 is suitably selected after taking into account the characteristics and intended application of the electromechanical transducer. In specific terms, it is possible to use lead titanate ($PbTiO_3$), lead titanate zirconate ($Pb(Zr,Ti)O_3$), lead zirconate ($PbZrO_3$), lead lanthanum titanate (($Pb,La),TiO_3$), lead lanthanum titanate zirconate (($Pb,La)(Zr,Ti)O_3$), lead zirconium-titanate magnesium-niobate ($Pb'(Zr,Ti)(Mg,Nb)O_3$), or the like. A film with superior piezoelectric characteristics can be obtained by suitable addition of niobium (Nb) to lead titanate or lead zirconate.

The ferroelectric thin film should be thin enough that cracks do not form during the manufacturing process, but should be thick enough that it will exhibit sufficient displacement characteristics. In particular, because this embodiment involves a structure with which the adhesive metal will not diffuse into the ferroelectric thin film even after a heat treatment has been conducted numerous times, it is possible for the film to be made thicker than conventional products by numerous heat treatments. In the past, adhesion was diminished by diffusion of the adhesive metal if the baking was carried out more than twice, but with this embodiment, there is no loss of adhesion even after baking four or more times. Accordingly, the thickness of the ferroelectric thin film 44 can be 1 $\mu$m or more, for example.

Working Example

Figure 10A:
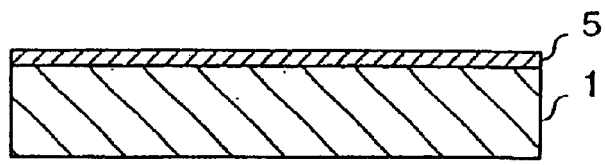
FIGS. 10A to 10F are cross sectional diagrams of the steps for manufacturing an electromechanical transducer.

Next, a method for manufacturing an ink jet recording head, including the method of the present invention for manufacturing an electromechanical transducer, will be described through reference to FIGS. 10 and 11. First, a diaphragm film 5 was formed on the surface of a pressure chamber substrate 1 composed of a silicon monocrystalline substrate (FIG. 10A). In this step, a high-temperature treatment should be carried out in an oxidative atmosphere containing oxygen or steam by means of a commonly used thermal oxidation method or the like to form a thermal oxidation film composed of silicon dioxide. The result of this step was the formation of the diaphragm film 5 in a suitable thickness (1.0 $\mu$m, for instance) over the pressure chamber substrate 1 of a specific thickness (220 $\mu$m, for instance). Instead of a silicon oxide film, it is also possible to form a zirconium oxide film, tantalum oxide film, silicon nitride film, or aluminum oxide film. The diaphragm may also consist of a laminate structure of a silicon oxide film and a zirconium oxide film or the like. To produce a laminate structure, for example, a silicon oxide film is formed as above in a thickness of about 1 $\mu$m over a silicon monocrystalline substrate, after which a zirconium layer is formed by sputtering, vacuum vapor deposition, or another such method. A high-temperature treatment should then be performed in an oxygen atmosphere, and a zirconium oxide film formed in a thickness of about 400 nm.

Figure 10B:
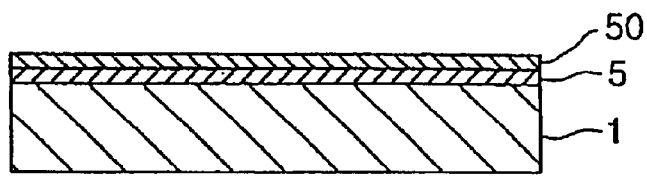

Next, a layer 50 was formed from an adhesive metal over the diaphragm film 5 (FIG. 10B). The adhesive metal here refers to titanium or chromium. These metals are readily diffused by heat treatment during the subsequent formation of the ferroelectric thin film 44, but after diffusion they move to the anti-diffusion layer 43 and eventually remain in the adhesive layer 41, where they serve to bond the bottom electrode 42 and the diaphragm film 5 together. Sputtering, vacuum vapor deposition, or another such method may be used to form the adhesive metal layer 50. The adhesive metal layer 50 should be thick enough to allow an adequate supply of metal for adhesion, but not so thick that there will be no diffusion to the ferroelectric thin film. A thickness of about 20 nm is good.

Figure 10C:
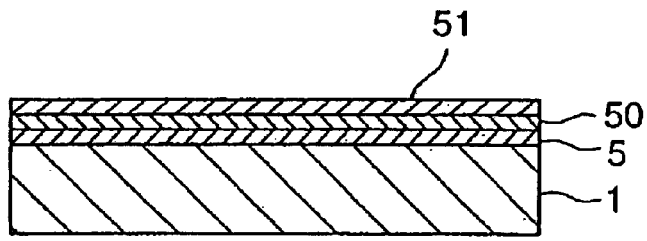

Next, a layer 51 of anti-diffusion metal was formed over the adhesive metal layer 50 (FIG. 10C). This layer leaves behind part of the adhesive metal diffused by the subsequent heat treatment, and functions as the adhesive layer 41 that enhances the adhesive strength between the bottom electrode 42 and the diaphragm film 5. Sputtering, vacuum vapor deposition, or another such method is used to form the first anti-diffusion metal layer 51. The first anti-diffusion metal layer 51 should be thick enough that it will cause part of the adhesive metal diffused in the direction of the ferroelectric thin film to remain behind. A thickness of about 20nm is good, for example.

Figure 10D:
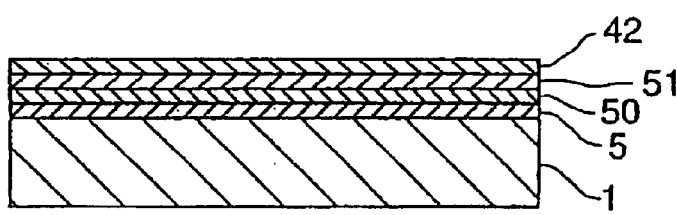

Next, a layer 42 of a bottom electrode was formed over the first anti-diffusion metal layer 51 (FIG. 10D). Sputtering or another such method was used to form the bottom electrode 42. With a conventional product, the film thickness had to be at least 500 nm in order to prevent the diffusion of titanium, but with this embodiment the anti-diffusion metal prevents the diffusion of titanium, so the film can be formed in a thickness of 400 nm or less.

Figure 10E:
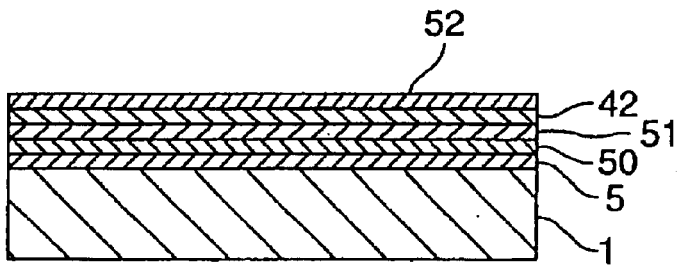

Next, a layer 52 of anti-diffusion metal was formed over the bottom electrode 42 (FIG. 10E). This layer functions as a barrier that halts the diffusion of the adhesive metal that has diffused through the bottom electrode 42 as a result of the subsequent heat treatment. Sputtering, vacuum vapor deposition, or another such method may be used to form the second anti-diffusion metal layer 52. The second anti-diffusion metal layer 52 should be thick enough to halt the diffusion of the adhesive metal into the ferroelectric thin film, and a film thickness of about 20 nm is good, for example. It is preferable for the adhesive metal layer, the first anti-diffusion metal layer, the bottom electrode, and the second anti-diffusion metal layer to be formed continuously in a vacuum in order to prevent contamination.

Next, the ferroelectric thin film 44 was formed by lamination of a ferroelectric thin film by sol-gel method (FIG. 10F to FIG. 11H). The adhesive metal layer 50 was diffused all the way to the second anti-diffusion metal layer 52, and the anti-diffusion layer 43 produced at the location of this second anti-diffusion metal layer 52, by the baking treatment performed for the drystallization of the ferroelectric thin film. This step also involves promoting the alloying of the first anti-diffusion metal layer 51 with the bottom electrode 42, and thereby producing the adhesive layer 41 at the location of the adhesive metal layer 50 and the first anti-diffusion metal layer 51.

Figure 10F:
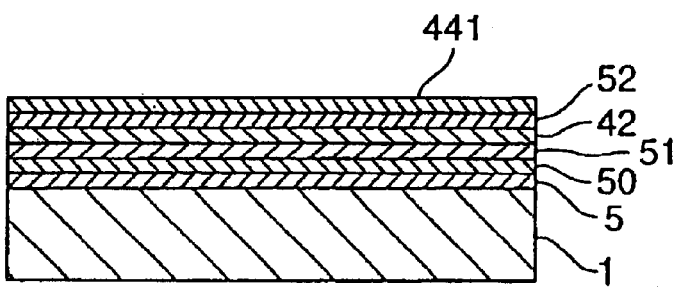
Figure 11G:
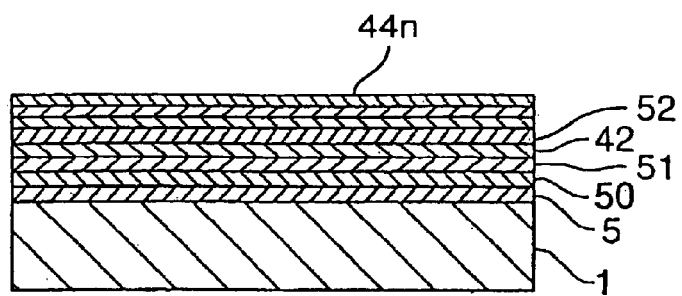
FIGS. 11G–11K are cross sectional diagrams of the main steps for manufacturing an ink jet recording head.

First, a sol composed of an organometal alkoxide was applied by spin coating or another coating method over the bottom electrode 42. This coating was then dried for a specific length of time at a specific temperature to evaporate the solvent. After drying, degreasing was performed for a specific time at a specific high temperature in an air atmosphere, and the organic ligands coordinated to the metal were pyrolyzed, which yielded a metal oxide. These steps of coating, drying, and degreasing were repeated a specific number of times (such as four or more) to laminate four or more layers of ferroelectric thin film precursor 441 to 44$n$ ($n$ is the number of coatings) (FIG. 10F→FIG. 11G→FIG. 10F→FIG. 11G . . . ). As a result of this drying and degreasing, the metal alkoxide and acetate in the solution formed a network of metal-oxygen-metal via the pyrolysis of ligands. After the ferroelectric thin film precursors had been laminated a specific number of times, a baking treatment was performed in a specific atmosphere. This baking treatment formed a perovskite crystal structure having anything from an amorphous gel structure to any kind of crystal structure.

Figure 11H:
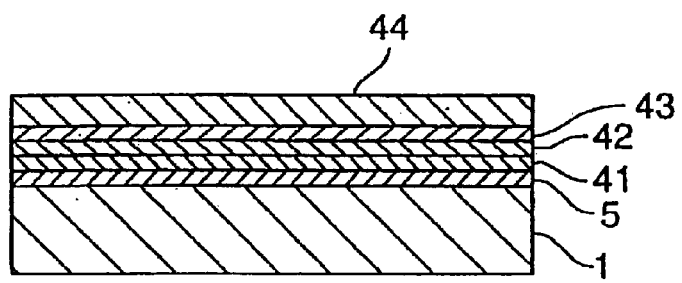

In the course of the above-mentioned heat treatment, the titanium in the adhesive metal layer 50 diffuses along the grain boundaries of the crystals. Part of this diffusion is prevented by the first anti-diffusion metal layer 51. Meanwhile, the platinum of the bottom electrode 42 diffuses somewhat toward this first anti-diffusion metal layer 51. As a result, an alloy layer consisting of the diffused metal, the metal that makes up the bottom electrode, and the adhesive metal is formed at the location of the first anti-diffusion metal layer 51 and the adhesive metal layer 50. This is the adhesive layer 41 (FIG. 11H).

The titanium in the adhesive metal layer 50 passes through the bottom electrode 42 and reaches the second anti-diffusion metal layer 52, where this diffusion is stopped. Accordingly, an alloy layer of the anti-diffusion metal and the adhesive metal is formed at the location of the second anti-diffusion metal layer 52. This is the anti-diffusion layer 43 (FIG. 11H).

Figure 11I:
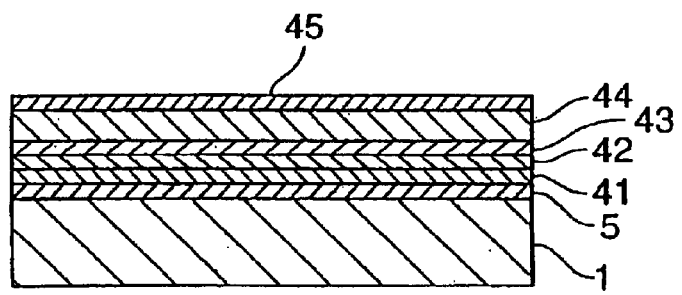

Next, the top electrode 45 was formed by electron beam vapor deposition, sputtering, or another such method over the ferroelectric thin film 44 (FIG. 11I). Platinum, iridium, or the like was used for the material of the top electrode, and the thickness was about 100 nm.

The basic form of the electromechanical transducer is complete at the above step. This electromechanical transducer can be made to operate as the piezoelectric device of the present invention if it is etched into a shape suited to the place where it is to be used and if it is manufactured such that voltage can be applied between the top and bottom electrodes. With this embodiment, the laminate structure of the above-mentioned piezoelectric device was etched to match the ink jet recording head, and the ink jet recording head was then manufactured by the steps described below. FIG. 11 illustrates the cross sectional structure of three electromechanical transducers in particular, but in actual practice the number and spacing of the electromechanical transducers may be varied according to the resolution of the ink jet recording head.

Figure 11J:
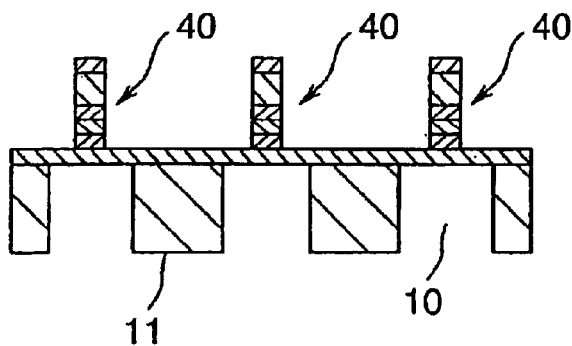

First, after the formation of the laminate structure of the various electromechanical transducers, the top electrode 45, the ferroelectric thin film 44, the anti-diffusion layer 43, the bottom electrode 42, and the adhesive layer 41 were masked in a shape matching the pressure chambers 10, and etching was performed around this mask (FIG. 11J). In specific terms, first a resist material was applied over the top electrode in a uniform thickness by spinner method, spraying, or another such method, a mask was formed in the shape of the electromechanical transducers, and then exposure and developing were performed to form a resist pattern over the top electrode 45. This product was subjected to ordinary ion milling, dry etching, or another such process to etch away the top electrode 45, ferroelectric thin film 44, anti-diffusion layer 43, bottom electrode 42, and adhesive layer 41 and shape the electromechanical transducers 40.

Next, the pressure chambers 10 were formed by etching the other side of the pressure chamber substrate 1 from that on which the electromechanical transducers 40 were formed (FIG. 11J). For example, the spaces for the pressure chambers 10 were etched into the silicon substrate by anisotropic etching, parallel plate type of reactive ion etching, or another form of anisotropic etching using an active gas. The unetched portion that remains behind becomes the side walls 11.

Figure 11K:
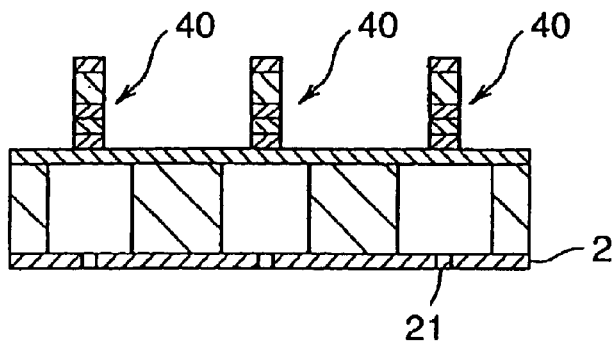

Finally, the nozzle plate 2 is bonded to the etched pressure chamber substrate 1 with an adhesive agent to manufacture the main components of an ink jet recording head (FIG. 11K). When the parts are bonded together, the nozzles 21 are aligned so that they will be arranged in the spaces of the various pressure chambers 10. The pressure chamber substrate 1 with its bonded nozzle plate 2 is attached to a housing to complete an ink jet recording head 1. Instead of the nozzle plate 2 being bonded, the nozzle plate 2 and the pressure chamber substrate 1 may be formed by integral etching. There is no need for the bonding step when the nozzle plate and the pressure chamber substrate are manufactured at the same time by integral etching. The nozzles are made at positions corresponding to the pressure chambers 10.

Figure 12:
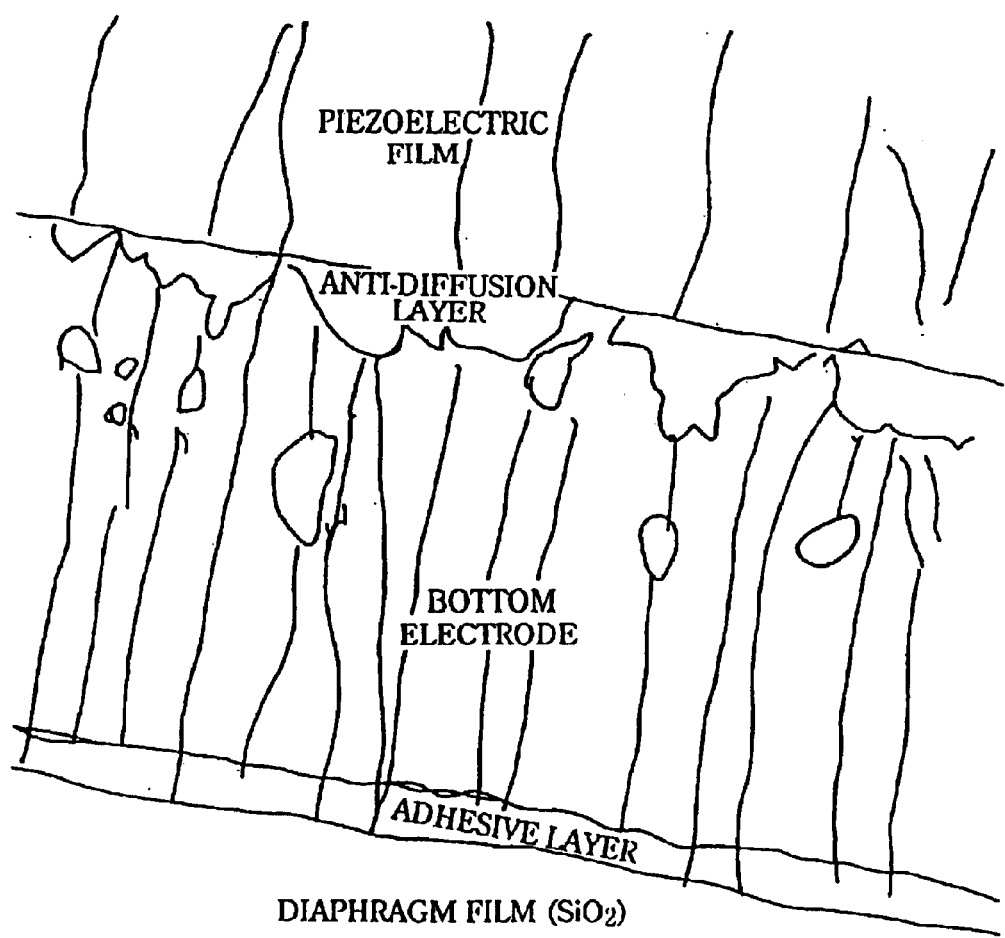
FIG. 12 is a drawing of a cross sectional TEM photograph of an ink jet recording head.

In the above manufacturing method, the electromechanical transducers were formed using titanium as the adhesive metal, platinum as the bottom electrode, iridium as the anti-diffusion metal, and PZT-PMN as the ferroelectric thin film. FIG. 12 is a drawing of a cross sectional TEM (Transmission Electron Microscopy) photograph of the crystal structure thereof. As this figure confirms, an adhesive layer has been formed in which alloying has proceeded between the diaphragm film and the bottom electrode. It also confirms the formation of an anti-diffusion layer which is an alloy layer of anti-diffusion metal crystals and adhesive metal at the interface between the bottom electrode and the ferroelectric thin film.

Figure 13:
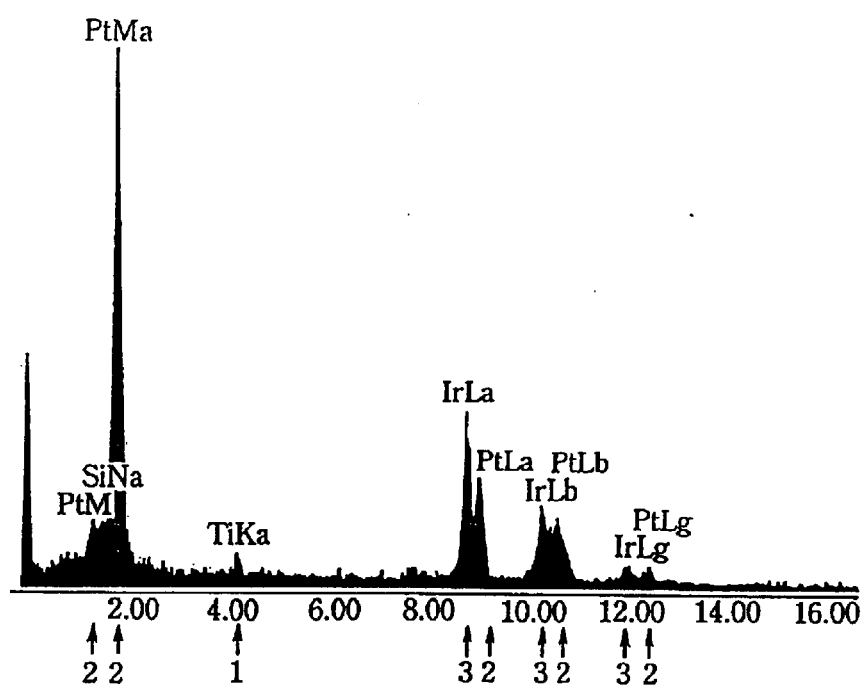
FIG. 13 is a compositional analysis graph for the adhesive layer after heat treatment.

FIG. 13 is a compositional analysis graph for the adhesive layer. This figure relates to the composition of that region of the adhesive layer relatively near the bottom electrode. As can be seen from the figure, with this embodiment only a tiny amount of titanium (arrow 1), which is the composition of the adhesive metal layer that had been formed at this location prior to heat treatment, remains. Instead, platinum (Pt; arrow 2), which is the metal that makes up the bottom electrode, and iridium (Ir; arrow 3), which is the anti-diffusion metal that had made up the anti-diffusion metal layer prior to heat treatment, are present. It can be confirmed that the two metals have been alloyed. The heat treatment causes the titanium to diffuse, and the platinum in the bottom electrode and the iridium in the anti-diffusion metal layer move in and form an adhesive layer.

Figure 14:
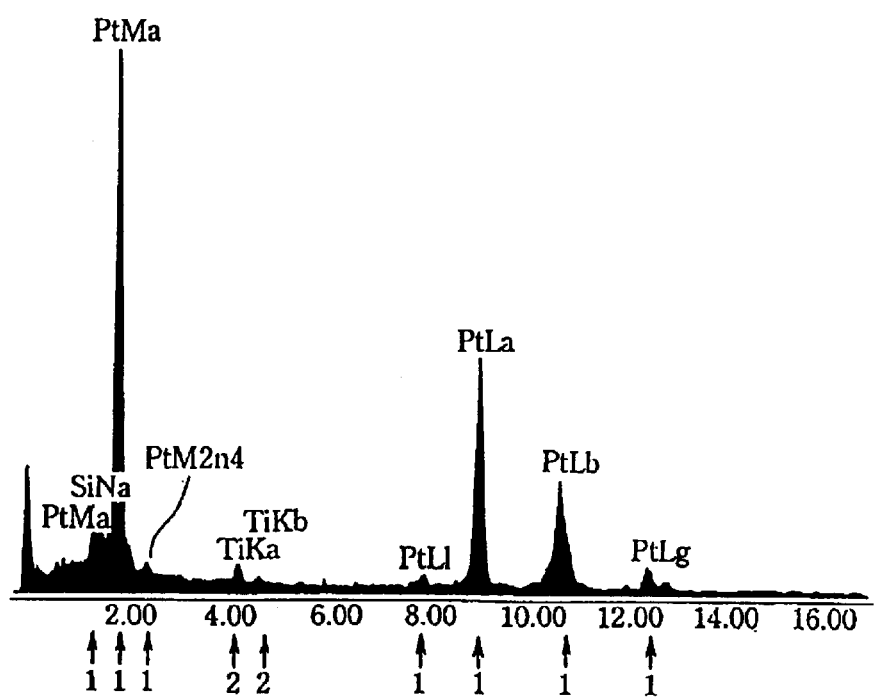
FIG. 14 is a compositional analysis graph for the bottom electrode after heat treatment.

FIG. 14 is a compositional analysis graph for the bottom electrode. As can be seen from the figure, the platinum (Pt; arrow 1) present from the outset accounts for virtually all of the composition. Part of the titanium (Ti; arrow 2) that is the adhesive metal that has diffused from the adhesive metal layer remains.

Figure 15:
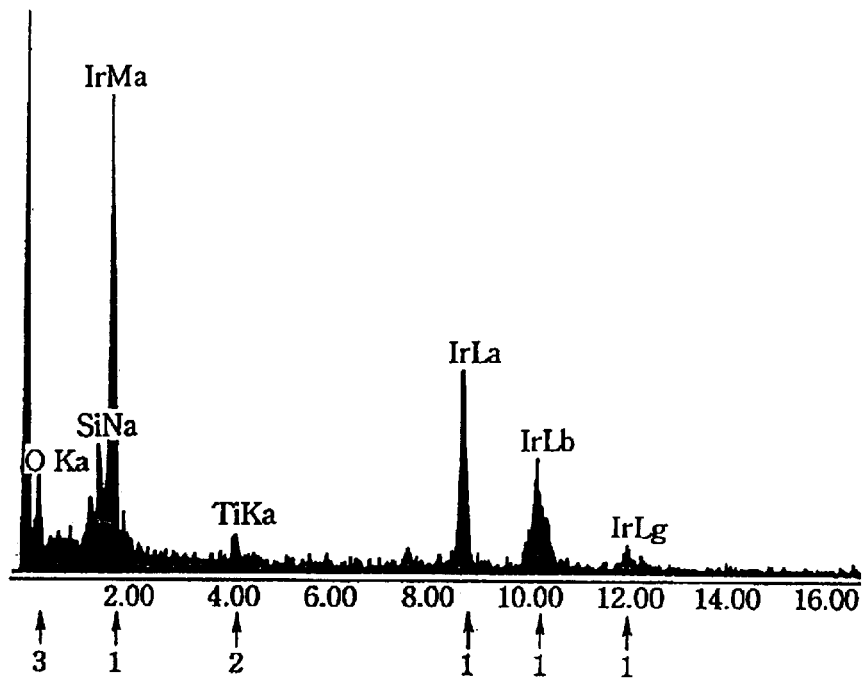
FIG. 15 is a compositional analysis graph for the adhesive layer after heat treatment.

FIG. 15 is a compositional analysis graph for the adhesive layer. As shown in this figure, the iridium (Ir; arrow 1) that is the anti-diffusion metal that had been formed in the anti-diffusion metal layer prior to heat treatment is present. Also beginning to appear is the titanium (Ti; arrow 2) that is the adhesive metal that has diffused from the adhesive metal layer. Also present is the oxygen (O; arrow 3) that has moved from the ferroelectric thin film. The composition here is a mixture of almost completely unoxidized iridium and titanium oxide. Specifically, it can be seen that the anti-diffusion layer prevents the titanium from moving to the ferroelectric thin film, and prevents the oxygen from escaping from the ferroelectric thin film to the bottom electrode.

Table 2 shows the change in adhesion when the composition of the anti-diffusion layer and adhesive layer was varied. In the comparative examples, there is no layer corresponding to the anti-diffusion layer, and the adhesive layer consists of titanium.

TABLE 2

| Electrode constitution | Bottom electrode thickness | Ferroelectric thin film thickness | Number of bakings | Adhesive strength (mN) |
|---|---|---|---|---|
| Compar. Example | 500 nm | 0.8 μm | 2 | 17.8 |
| Working Example | 500 nm | 0.8 μm | 2 | 18.0 |
| Compar. Example | 500 nm | 1.2 μm | 4 | 14.2 |
| Working Example | 500 nm | 1.2 μm | 4 | 18.8 |
| Compar. Example | 300 nm | 1.2 μm | 4 | 9.8 |
| Working Example | 300 nm | 1.2 μm | 4 | 19.8 |

As can be seen from Table 2, adhesion was better in the working examples than the comparative examples. In particular, there was a relative increase in adhesion when the number of bakings was increased and the thickness of the ferroelectric thin film was over 1 μm. Therefore, the layer structure of this embodiment is also effective when the ferroelectric thin film thickness is increased to over 1 μm.

Next, Table 3 shows the breakdown voltage and piezoelectric constant $d_{31}$ of an electromechanical transducer in working examples and comparative examples of the above-mentioned layer structure when the thickness of the bottom electrode was 500 nm and the thickness of the ferroelectric thin film was varied.

TABLE 3

| Electrode constitution | Ferroelectric thin film thickness | Breakdown voltage | Piezoelectric constant at 15 V (pC/V) | Piezoelectric constant at 25 V (pC/V) |
|---|---|---|---|---|
| Compar. Example | 0.8 μm | 41 V | 178 | 161 |
| Working Example | 0.8 μm | 60 V | 196 | 175 |
| Compar. Example | 1.2 μm | 62 V | 191 | 170 |
| Working Example | 1.2 μm | 93 V | 240 | 195 |

As can be seen from Table 3, the breakdown voltage and piezoelectric constant $d_{31}$ are higher in the working examples than the comparative examples. The reason for this is that no low-dielectric constant layer is present at the interface between the bottom electrode and the ferroelectric thin film in the electromechanical transducers of the working examples. The reason the value of the piezoelectric constant $d_{31}$ varies with the measured voltage is that, because the applied electrical field intensity is high with an electromechanical transducer, there is a tendency for the piezoelectric constant $d_{31}$ to decrease as the electrical field increases in intensity. Thus, increasing the thickness of the ferroelectric thin film is an effective way to enhance the characteristics of an electromechanical transducer. Making the ferroelectric thin film too thick, however, is undesirable because the displacement efficiency will decrease. For example, a ferroelectric thin film thickness that is favorable for a high-resolution ink jet recording head is probably about 1 or 2 μm.

Embodiment 5 of the Invention

This embodiment relates to an electromechanical transducer formed at a relatively low temperature, to a method for manufacturing this electromechanical transducer, and to an ink jet recording head and ink jet printer that make use of the same.

Figure 16:
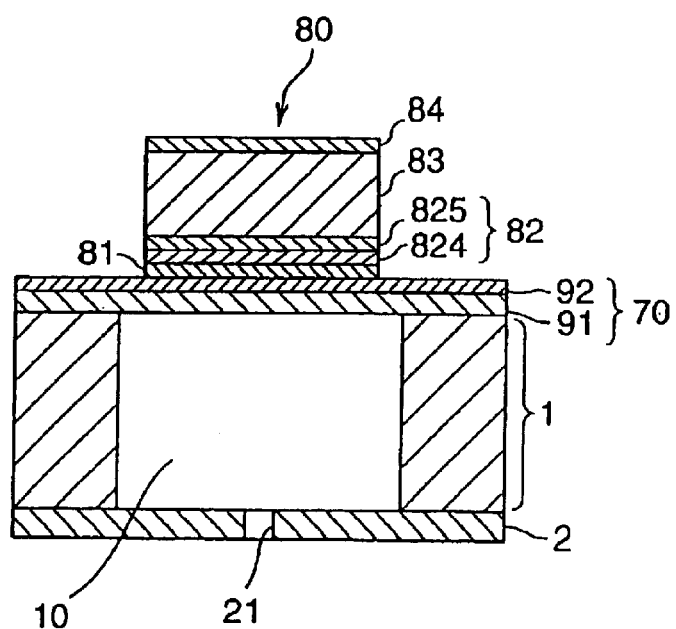
FIG. 16 is a cross sectional diagram of an electromechanical transducer.

FIG. 16 is a cross sectional diagram of a layer structure, in which the electromechanical transducer portion of an ink jet recording head in this embodiment has been enlarged.

As shown in this figure, an electromechanical transducer 80 comprises an interlayer 92, an adhesive layer 81, a bottom electrode 82, a ferroelectric thin film (piezoelectric film) 83, and a top electrode 84, all laminated over an oxide film 91 that forms the installation surface.

The interlayer 92 is an elastic layer, and together with the oxide film 91, constitutes a diaphragm film 70. The interlayer 92 is formed from a compound selected from the group consisting of zirconium oxide, tantalum oxide, silicon nitride, and aluminum oxide. Here, it is formed from zirconium oxide. The interlayer 92 is thick enough to function as an elastic layer (for example, a thickness between 200 and 800 nm).

The adhesive layer 81 is formed between the interlayer 92 and the bottom electrode 82, from a metal that adheres to these two layers. This adhesive layer serves to improve the adhesion of the electromechanical transducer to the installation surface, but it need not be formed when good adhesion can be ensured. Titanium and chromium are examples of metals with good adhesion. The adhesive layer 81 should be thick enough to ensure the minimum acceptable adhesion, such as 10 nm or more.

The bottom electrode 82 consists of a first layer 824 and a second layer 825. The first layer 824 and second layer 825 are formed as a result of the movement of the composition resulting from the manufacturing method of this embodiment, as discussed below.

The first layer 824 is a layer composed of an alloy of iridium and a specific metal, provided over the interlayer 92. An example of this metal is platinum. This alloy is produced when the iridium (821) provided under the metal layer (822) of platinum or the like is moved by heat to the metal layer and alloyed there. Accordingly, the first layer 824 is not uniformly mixed throughout the entire layer, and instead has a somewhat heterogeneous crystal structure in which iridium crystals are admixed in the crystallization of the platinum or other metal.

The second layer 825 is provided over the first layer 824, and is formed as a layer containing iridium. This layer is produced when the iridium layer (823) provided from the outset is crystallized as it is.

In the bottom electrode 82 consisting of the first layer 824 and the second layer 825, the volumetric ratio of the bottom electrode 82 accounted for by the alloy containing iridium (such as an alloy of the titanium or other metal that has moved from the adhesive layer 81, the oxygen that has escaped from the ferroelectric thin film 83, and iridium) is at least 2/5 and no more than 4/5.

The ferroelectric thin film 83 is a ferroelectric consisting of an ordinary piezoelectric ceramic. Favorable examples include a ferroelectric piezoelectric material such as lead titanate-zirconate (PZT), or the product of adding to this a metal oxide such as magnesium oxide or nickel oxide, or niobic acid. The composition of the ferroelectric thin film 83 is suitably selected after taking into account the characteristics and intended application of the electromechanical transducer. In specific terms, it is possible to use lead titanate ($PbTiO_3$), lead titanate zirconate ($Pb(Zr,Ti)O_3$), lead zirconate ($PbZrO_3$), lead lanthanum titanate ($(Pb,La)TiO_3$) lead lanthanum titanate zirconate ($(Pb,La)(Zr,Ti)O_3$), lead zirconium-titanate magnesium-niobate ($Pb'(Zr,Ti)(Mg,Nb)O_3$), or the like. A film with superior piezoelectric characteristics can be obtained by suitable addition of niobium (Nb) to lead titanate or lead zirconate.

The ferroelectric thin film should be thin enough that cracks do not form during the manufacturing process, but should be thick enough that it will exhibit sufficient displacement characteristics.

The top electrode 84 is an electrode paired with the bottom electrode 82, and is formed from a specific metal such as platinum or iridium. The thickness thereof is about 100 nm.

Working Example

An example of manufacturing the electromechanical transducer and ink jet recording head of the present invention will now be described through reference to FIGS. 17 and 18.

Figure 17A:
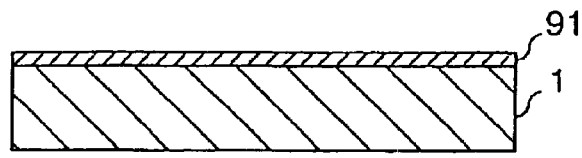
FIG. 17 is cross sectional diagrams of the steps for manufacturing an electromechanical transducer.

First, the oxide film 91 was formed on the surface of the pressure chamber substrate 1 (FIG. 17A). In this step, a high-temperature treatment is carried out in an oxidative atmosphere containing oxygen or steam to form the oxide film 91 composed of silicon dioxide. Any thermal oxidation method or CVD that is ordinarily used can be used in this step as well. The result of this step was the formation of the oxide film 91 in a suitable thickness (1.0 μm, for instance) over the pressure chamber substrate 1 composed of a silicon monocrystalline substrate of a specific thickness (220 μm, for instance).

Figure 17B:
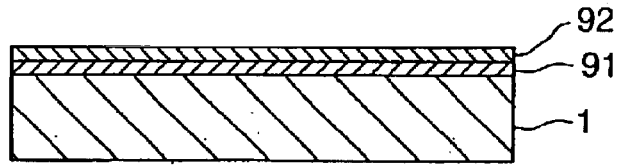

Next, the interlayer 92 was formed over the oxide film 91 (FIG. 17B). A compound selected from the group consisting of zirconium oxide, tantalum oxide, silicon nitride, and aluminum oxide was used as the material for this interlayer. If zirconium oxide is used, for example, first a zirconium layer is formed over the oxide film 91 by sputtering, vacuum vapor deposition, or another such method, and this product is treated at high temperature in an oxygen atmosphere to produce a interlayer 92 of zirconium oxide. The thickness thereof should be about 400 nm.

Figure 17C:
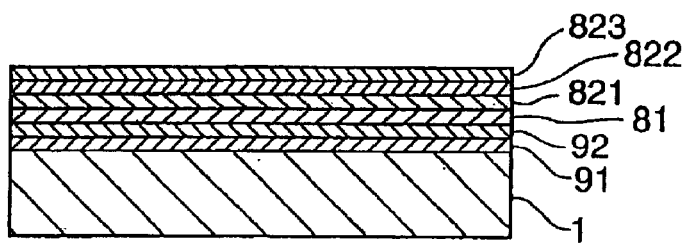

Next, the bottom electrode 82 was formed over the diaphragm film 70 formed in the above step (FIG. 17C). In this example, the adhesive layer 81 was further formed from an adhesive metal between the electromechanical transducer 80 and the diaphragm film 70 in order to prevent these from separating. "Adhesive metal" refers to titanium or chromium. Sputtering, vacuum vapor deposition, or the like may be used to form the film. The adhesive layer 81 should be thick enough for it to function sufficiently as an adhesive metal layer, but not so thick that there will be no diffusion into the piezoelectric film. A thickness of about 10 nm or more is good.

The step of forming the bottom electrode comprises the steps of forming a first iridium layer 821, forming a metal layer 822, and forming a second iridium layer 823.

The first iridium layer 821 is formed by causing iridium to adhere by sputtering or another such method. The thickness of the first iridium layer 821 is important. Specifically, the thickness of the first iridium layer 821 is set such that the ratio of this thickness to the thickness of the bottom electrode 82 as a whole will be from 1/3 to 4/5. Since not only the thickness of this layer 821, but the thickness of the metal layer 822 and the second iridium layer 823 is also affected, the thickness of each layer is set after the required thickness of the bottom electrode 82 as a whole has been determined. Here, the thickness is adjusted such that the following relationship is satisfied:

$$dT=3.6 \times d_0+2.4 \times d_1+0.8 \times d_2+2.3 \times d_3 \tag{1}$$

when we let $d_0$ be the thickness of the adhesive layer prior to baking, $d_1$ be the thickness of the first iridium layer, $d_2$ be the thickness of the metal layer, $d_3$ be the thickness of the second iridium layer, and dT be the thickness of the bottom electrode overall after baking. This is because the stress moderation that is an object of the present invention can be accomplished more effectively when the lamination is in these proportions.

The metal layer 822 is formed by causing a specific conductive metal, such as platinum, to adhere by sputtering or another such method. There are no particular restrictions on the thickness thereof, but about 100 nm is good, for example.

The second iridium layer 823 is formed by again causing iridium to adhere over the metal layer 822 by sputtering or another such method. The second iridium layer 823 should be thick enough to prevent the iridium, titanium, or other such metal that has diffused through the metal layer 822 from diffusing into the piezoelectric film 20 nm or more is good, for example.

It is preferable for the adhesive layer 81, the first iridium layer 821, the metal layer 822, and the second iridium layer 823 to be formed continuously in a vacuum in order to prevent contamination.

Figure 17D:
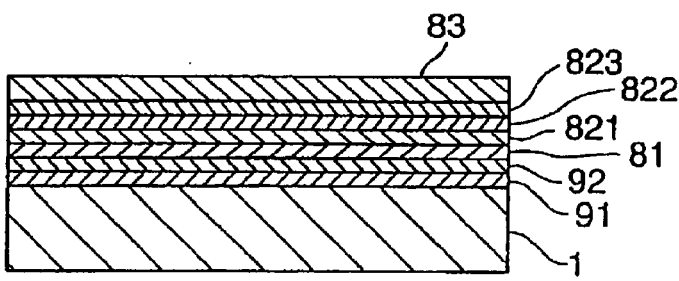

Next, the ferroelectric thin film 83 was formed by lamination of a ferroelectric thin film by sol-gel method (FIGS. 17D and E). First, a sol composed of an organometal alkoxide was applied by spin coating or another coating method over the bottom electrode 82. This coating was then dried for a specific length of time at a specific temperature to evaporate the solvent. After drying, degreasing was performed for a specific time at a specific high temperature in an air atmosphere, and the organic ligands coordinated to the metal were pyrolyzed, which yielded a metal oxide. These steps of coating, drying, and degreasing were repeated a specific number of times (such as four or more) to laminate four or more layers of ferroelectric thin film precursor. As a result of this drying and degreasing, the metal alkoxide and acetate in the solution formed a network of metal-oxygen-metal via the pyrolysis of ligands (FIG. 17D).

Figure 17E:
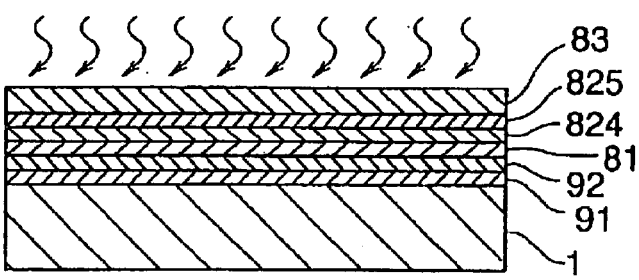

The ferroelectric thin film precursors were then baked and crystallized at a temperature of 750° C. or lower (FIG. 17E). This heat treatment diffused the iridium of the first iridium layer 821, and converted the first iridium layer 821 and the metal layer 822 into a first layer 824 that was an alloy layer in which iridium and platinum were alloyed.

This heat treatment also resulted in the ferroelectric thin film precursors forming a perovskite crystal structure from their amorphous form they had when they were precursors, and changed them into a thin film that exhibited an electromechanical transducing action.

Figure 17F:
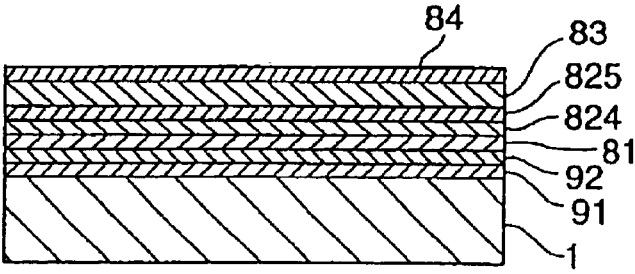

Finally, the top electrode 84 was formed over the ferroelectric thin film 83 by electron beam vapor deposition, sputtering, or another such method (FIG. 17F). Platinum, iridium, or the like may be used for the material of the top electrode, and the thickness is about 100 nm.

The basic form of the electromechanical transducer is complete at the above step. This electromechanical transducer can be made to operate as the piezoelectric device of the present invention if it is etched into a shape suited to the place where it is to be used and if it is manufactured such that voltage can be applied between the top and bottom electrodes. Thereafter, an ink jet recording head is completed by separating the electromechanical transducer by etching into transducers corresponding to the pressure chambers according to the steps illustrated in FIGS. 11J to L, and working the pressure chamber substrate.

With this embodiment, an electrode is sandwiched by an iridium layer over an interlayer, and baked at a temperature of 750° C. or lower, which effectively moderates the residual stress in the bottom electrode through the diffusion of the iridium, and makes it possible to provide an electromechanical transducer having good piezoelectric characteristics, and products to which this electromechanical transducer is applied.

Embodiment 6 of the Invention

This embodiment relates to the structure of an electromechanical transducer manufactured when baking is performed at a temperature over 750° C. in the manufacturing process of Embodiment 5.

Figure 18:
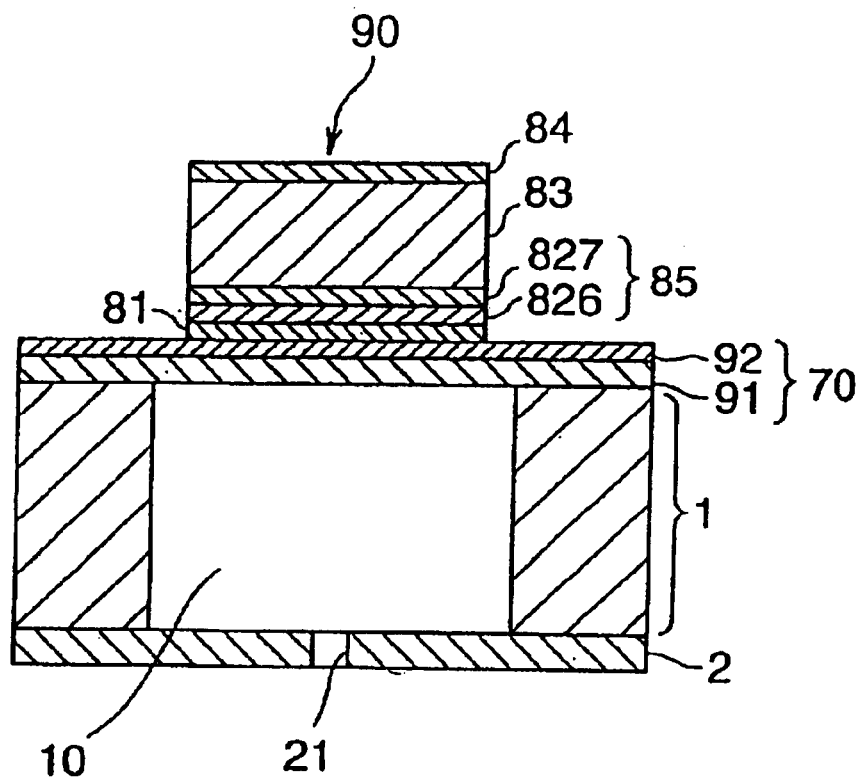
FIG. 18 is a cross sectional diagram of an electromechanical transducer.

FIG. 18 is a cross sectional diagram of the structure of a layer structure, in which the electromechanical transducer portion of an ink jet recording head in this embodiment has been enlarged.

As shown in this figure, an electromechanical transducer 90 comprises an interlayer 92, an adhesive layer 81, a bottom electrode 85, a ferroelectric thin film (piezoelectric film) 83, and a top electrode 84, all laminated over an oxide film 91 that forms the installation surface.

The interlayer 92, adhesive layer 81, ferroelectric thin film 83, and top electrode 84 are the same as in Embodiment 5, and therefore will not be described in detail.

The bottom electrode 85 consists of a first layer 826 and a second layer 827. The first layer 826 and second layer 827 are formed as a result of the movement of the composition resulting from the manufacturing method of this embodiment, as discussed below.

The first layer 826 is a layer composed of a specific metal provided over the interlayer 92. This layer is the layered structure resulting after the iridium (821) provided under the metal layer (822) prior to baking has been diffused by heat to the metal layer and passed therethrough. Accordingly, the first layer 826 consists almost entirely of metal originally present, such as platinum, but crystals of the iridium that has passed through may remain behind.

The second layer 827 is provided over the first layer 826, and is formed as a layer containing iridium. This layer is produced by the separate crystallization of iridium layers comprising a second iridium layer (823) provided from the outset and a first iridium layer (821) that has moved in via the metal layer (822).

In the bottom electrode 85 consisting of the first layer 826 and the second layer 827, the volumetric ratio of the bottom electrode 85 accounted for by the alloy containing iridium (such as an alloy of the titanium or other metal that has moved from the adhesive layer 81, the oxygen that has escaped from the ferroelectric thin film 83, and iridium) is at least 2/5 and no more than 4/5.

Working Example

Figure 19:
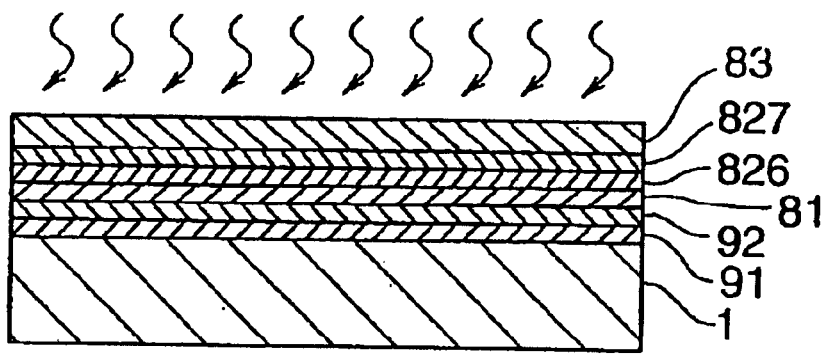
FIG. 19 is a cross sectional diagram of the step for manufacturing an electromechanical transducer.

An example of manufacturing an electromechanical transducer will now be described through reference to FIG. 19. The baking step in this manufacturing method is different from that described for FIGS. 17A–17F. The rest of the steps, such as the oxide film formation step (FIG. 17A), the interlayer formation step (FIG. 17B), the bottom electrode formation step (FIG. 17C), the ferroelectric thin film formation step (FIGS. 17D and E), and the top electrode formation step (FIG. 17F), are the same as in Embodiment 5 given above.

The baking step of this example is characterized in that the baking is performed at a temperature higher than 750° C. Baking at this relatively high temperature causes the iridium of the first iridium layer 821 to diffuse, and causes this iridium to pass through the metal layer 822 and move almost completely into the second iridium layer 823.

Also, this heat treatment results in the ferroelectric thin film precursors forming a perovskite crystal structure from their amorphous form they had when they were precursors, and changes them into a thin film that exhibited an electromechanical transducing action.

After the formation of the various layers of the electromechanical transducer, the step of forming the ink jet recording head and the structure of the printer in which this is utilized are the same as in Embodiment 5.

With this embodiment, an electrode is sandwiched by an iridium layer over an interlayer, and baked at a temperature higher than 750° C., which effectively moderates the residual stress in the bottom electrode through the diffusion of the iridium, and makes it possible to provide an electromechanical transducer having good piezoelectric characteristics, and products to which this electromechanical transducer is applied.

The inventors manufactured several electromechanical transducers by the above method, using zirconium oxide for the interlayer 92, titanium for the adhesive layer 81, and platinum for the metal layer 822. The transducer manufactured by the method of Embodiment 5 with the baking temperature set at 700° C. is termed Working Example 1, while the transducer manufactured by the method of Embodiment 6 with the baking temperature set at 850° C. is termed Working Example 2.

Figure 20:
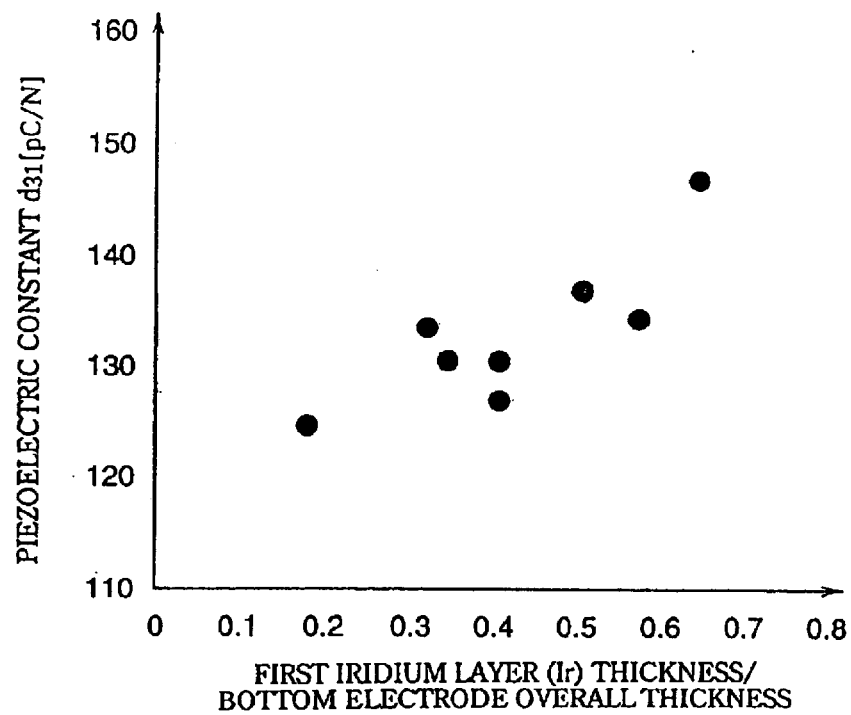
FIG. 20 is a measurement graph illustrating the relationship of the piezoelectric constant and the thickness of the first iridium layer with respect to the overall thickness of the bottom electrode prior to baking in an embodiment of baking at 700° C.
Figure 21:
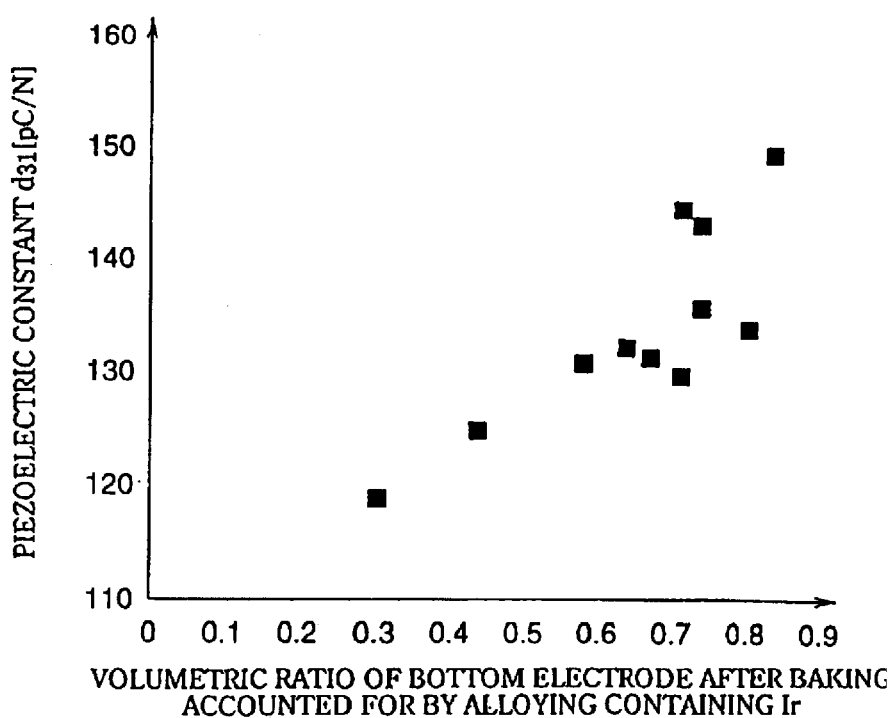
FIG. 21 is a measurement graph illustrating the relationship of the piezoelectric constant and the volumetric ratio of the bottom electrode after baking accounted for by the alloying containing iridium in an embodiment of baking at 700° C.

FIG. 20 shows the results of measuring the relationship between the piezoelectric constant $d_{31}$ and the ratio of the thickness of the first iridium layer to the thickness of the overall bottom electrode prior to baking in the electromechanical transducer of Working Example 1. FIG. 21 shows the results of measuring the relationship between the piezoelectric constant $d_{3f}$ and the volumetric ratio of the bottom electrode accounted for by the alloy containing iridium after baking in the electromechanical transducer of Working Example 1.

The piezoelectric constant before the pressure chambers were formed and the residual stress released was 150 pC/N in each case. Forming the pressure chambers tends to moderate the stress and lower the piezoelectric constant. The lower is this proportional decrease, the better are the characteristics.

Figure 22:
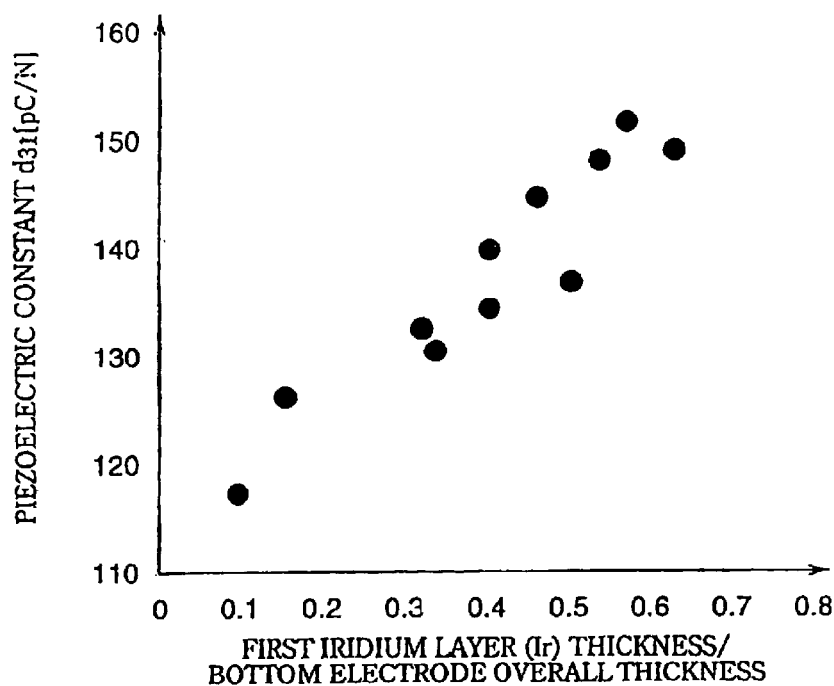
FIG. 22 is a measurement graph illustrating the relationship of the piezoelectric constant and the thickness of the first iridium layer with respect to the overall thickness of the bottom electrode prior to baking in an embodiment of baking at 850° C.

As can be seen from FIGS. 20 and 22, it was confirmed that regardless of the baking temperature, a piezoelectric device that exhibited good piezoelectric characteristics was obtained when the thickness ratio of the first iridium layer to the bottome electrode prior to baking was from about 1/3 to about 4/5.

Figure 23:
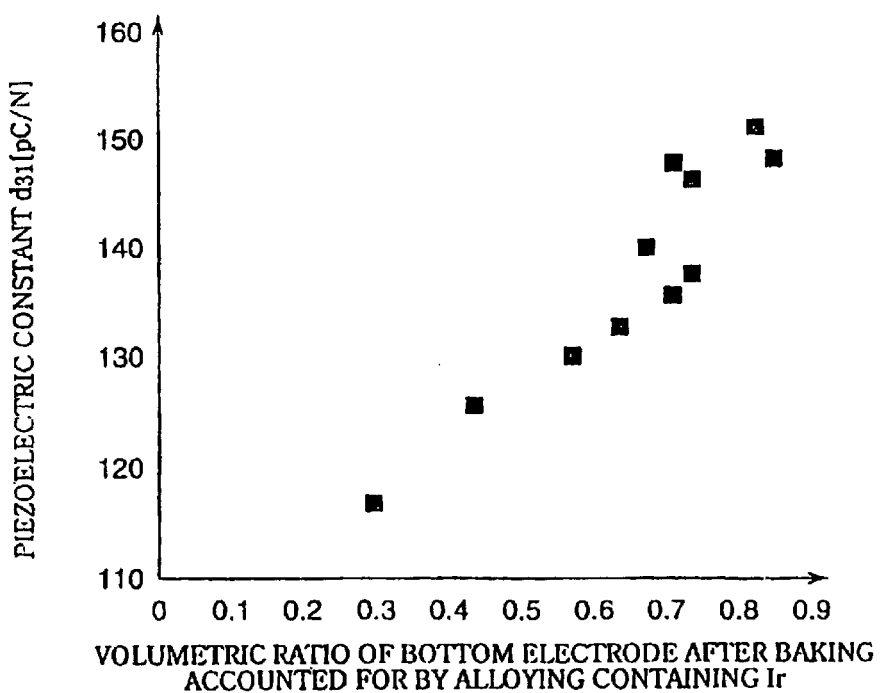
FIG. 23 is a measurement graph illustrating the relationship of the piezoelectric constant and the volumetric ratio of the bottom electrode after baking accounted for by the alloying containing iridium in an embodiment of baking at 850° C.

As can be seen from FIGS. 21 and 23, it was confirmed that regardless of the baking temperature, a piezoelectric device that exhibited good piezoelectric characteristics was obtained when the volumetric ratio of the bottom electrode accounted for by the alloy containing iridium after baking was at least 2/5 and no more than 4/5. The reason this volumetric ratio should not exceed 4/5 is that if this ratio is too high, the bottom electrode will consist almost entirely of iridium, and the device will be too hard and brittle to be used as an actuator for an ink jet recording head.

The relationship between the thickness of the adhesive layer, the first iridium layer, the metal layer, and the second iridium layer prior to baking, and the thickness of the overall bottom electrode after baking was confirmed to satisfy the relation of Formula 1 in both working examples.

The present invention is not limited to the embodiments given above, and can be applied with various modifications thereto. For instance, the ferroelectric thin film device manufactured with the present invention can be used in the manufacture not only of the ink discharge drive source of an ink jet recording head, but also a nonvolatile semiconductor memory device, a thin film capacitor, a pyroelectric detector, a sensor, a surface acoustic wave optical waveguide, an optical recording device, a space light modulator, a frequency doubler for a diode laser, and other such ferroelectric devices, dielectric devices, pyroelectric devices, piezoelectric devices, and electro-optical devices.

The present invention allows the orientation of a ferroelectric thin film to be controlled according to the intended application of a ferroelectric thin film device. In particular, the orientation of a ferroelectric thin film can be controlled merely by adjusting the thickness of the titanium layer, so there is no need for special equipment, and orientation can be controlled by a simple method.

The present invention also provides a method for manufacturing an electromechanical transducer with highly reliable drive characteristics, with which the amount of oxygen contained in a bottom electrode composed of iridium alone can be minimized during the baking of a ferroelectric thin film.

The present invention also comprises an adhesive layer and an anti-diffusion layer, so even if the bottom electrode is made thinner than in a conventional product, the adhesive metal will not become admixed in the piezoelectric film and form a low-dielectric constant layer, and the oxygen and lead in the ferroelectric thin film will not escape from the bottom electrode into the adhesive layer, so there is no deterioration in piezoelectric characteristics. Also, because the bottom electrode can be made thinner, there is greater freedom in choosing the material and thickness of the diaphragm film in an effort to optimize the displacement characteristics. Furthermore, reliability is enhanced because good adhesion can be maintained even if the ferroelectric thin film is made thinner.

Finally, the present invention provides an electromechanical transducer, and products to which this electromechanical transducer is applied, with higher reliability because residual stress is moderated through the movement of iridium during baking.

What is claimed is:

1. A method for manufacturing an electromechanical transducer comprising the steps of:

forming an adhesive metal layer composed of an adhesive metal over the surface where said transducer is installed;

forming a first anti-diffusion metal layer composed of an anti-diffusion metal over said adhesive metal layer;

forming a bottom electrode over said anti-diffusion metal layer;

forming a second anti-diffusion metal layer composed of said anti-diffusion metal over said bottom electrode; and forming a ferroelectric thin film over said second anti-diffusion metal layer through baking, and thereby diffusing said adhesive metal all the way to said second anti-diffusion metal layer and producing an anti-diffusion layer at the location of said second anti-diffusion metal layer promoting the alloying of said anti-diffusion metal and said bottom electrode, and producing an adhesive layer at the location of said adhesive metal layer and said first anti-diffusion metal layer.

2. The method for manufacturing a electromechanical transducer according to claim 1, wherein a metal selected from the group consisting of iridium, palladium, rhodium, ruthenium, and osmium is used as the anti-diffusion metal.

3. The method for manufacturing a electromechanical transducer according to claim 1, wherein either titanium or chronium is used as said adhesive metal.

* * * * *